US008222600B2

(12) United States Patent
Zarchin et al.

(10) Patent No.: US 8,222,600 B2

(45) Date of Patent: Jul. 17, 2012

(54) CHARGED PARTICLE DETECTION SYSTEM AND METHOD

(75) Inventors: Oren Zarchin, Raanana (IL); Semyon Shofman, Qiriat Ekron (IL)

(73) Assignee: El-Mul Technologies Ltd., Tamar Science Park, Rehovot (IL)

( * ) Notice: Subject to any disclaimer, the term of this patent is extended or adjusted under 35 U.S.C. 154(b) by 144 days.

(21) Appl. No.: 12/785,453

(22) Filed: May 23, 2010

(65) Prior Publication Data

US 2010/0294931 A1 Nov. 25, 2010

Related U.S. Application Data

(60) Provisional application No. 61/180,876, filed on May 24, 2009.

(51) Int. Cl.

*H01J 37/244* (2006.01)

*G01N 23/225* (2006.01)

(52) U.S. Cl. ......................... 250/307; 250/310; 250/397

(58) Field of Classification Search .......... 250/306–311, 250/396 R–400

See application file for complete search history.

(56) References Cited

U.S. PATENT DOCUMENTS

| | | | |
|---|---|---|---|
| 3,538,328 | A | 11/1970 | Strausser |
| 3,894,233 | A | 7/1975 | Tamura et al. |
| 3,936,695 | A | 2/1976 | Schmidt |
| 4,101,771 | A | 7/1978 | Hofer et al. |
| 4,587,425 | A | 5/1986 | Plows |
| 4,639,301 | A | 1/1987 | Doherty et al. |
| 4,658,137 | A | 4/1987 | Garth et al. |
| 4,785,182 | A | 11/1988 | Mancuso et al. |
| 4,800,976 | A | 1/1989 | Okada et al. |
| 4,818,872 | A | 4/1989 | Parker et al. |
| 4,897,545 | A | 1/1990 | Danilatos |
| 5,250,808 | A | 10/1993 | Danilatos et al. |
| 5,747,816 | A | 5/1998 | Kurosaki |
| 5,844,416 | A | 12/1998 | Campbell et al. |
| 5,990,483 | A | 11/1999 | Shariv et al. |
| 6,236,053 | B1 | 5/2001 | Shariv |
| 6,570,163 | B1 | 5/2003 | El Gomati et al. |
| 6,614,019 | B2 | 9/2003 | Feller et al. |
| 6,730,907 | B1 | 5/2004 | Feuerbaum et al. |
| 6,828,729 | B1 | 12/2004 | Owens et al. |

(Continued)

FOREIGN PATENT DOCUMENTS

| | | |
|---|---|---|
| EP | 0752715 | 1/1997 |

(Continued)

*Primary Examiner* — Jack Berman

*Assistant Examiner* — David E Smith

(74) *Attorney, Agent, or Firm* — Daniel J. Swirsky; AlphaPatent Associates Ltd.

(57) ABSTRACT

A system for selectively detecting charged particles produced due to operation of a charged particle beam column irradiating a specimen, including a proximal grid being selectively electrically biasable and configured for controllably directing the charged particles by electrically focusing the charged particles to compel selected secondary charged particles, whereupon being selected from the charged particles, to be attracted thereto, and to repel unselected secondary charged particles therefrom, a distal grid spaced apart from the proximal grid and separated therefrom by a gap and being selectively electrically biasable and configured for attracting the selected secondary and/or tertiary charged particles, whereupon being selected from the charged particles, to the distal grid, and to repel unselected tertiary charged particles therefrom, and a charged particle detector configured for detecting selected secondary charged particles attracted to the proximal and/or distal grid and detecting selected tertiary charged particles attracted to the distal grid, that impinge thereupon.

33 Claims, 13 Drawing Sheets

300 100 320 322 120 290 124 332 330 324 286 280 344 334 336 346 210 260 174 194 108 200 220 202 102 188 198 234 230 106 140 168 166 132 110 160 190 178 180 192 130 VIEW A

U.S. PATENT DOCUMENTS

| | | | | |
|---|---|---|---|---|
| 6,861,650 | B2 | 3/2005 | Kondo et al. | |
| 6,888,918 | B2 | 5/2005 | Horai et al. | |
| 6,940,066 | B2 | 9/2005 | Makarov et al. | |
| 6,982,428 | B2 | 1/2006 | Stresau et al. | |
| 7,009,187 | B2 | 3/2006 | Gerlach et al. | |
| 7,141,785 | B2 | 11/2006 | Bateman et al. | |
| 7,180,060 | B2 | 2/2007 | Chefetz et al. | |
| 7,227,142 | B2 | 6/2007 | Parker | |
| 7,230,386 | B2 | 6/2007 | Yui et al. | |
| 7,417,235 | B2 | 8/2008 | Schon et al. | |
| 7,462,839 | B2 | 12/2008 | Gnauck et al. | |
| 7,847,268 | B2 | 12/2010 | Shofman et al. | |
| 2005/0173644 | A1* | 8/2005 | Gnauck et al. | 250/370.11 |
| 2006/0289748 | A1* | 12/2006 | Schon et al. | 250/306 |
| 2008/0121803 | A1 | 5/2008 | Shojo et al. | |
| 2009/0166521 | A1* | 7/2009 | McGann et al. | 250/281 |
| 2009/0200463 | A1* | 8/2009 | Degenhardt et al. | 250/307 |
| 2009/0242791 | A1* | 10/2009 | Chen et al. | 250/397 |
| 2009/0309021 | A1 | 12/2009 | Schon et al. | |

FOREIGN PATENT DOCUMENTS

| | | |
|---|---|---|
| EP | 1365260 | 11/2003 |
| EP | 1420243 | 5/2004 |
| EP | 1636819 | 3/2006 |
| JP | 7312198 | 11/1995 |
| JP | 8083589 | 3/1996 |
| JP | 10116580 | 5/1998 |
| WO | 88-09564 | 12/1988 |
| WO | 89-08367 | 9/1989 |
| WO | 2005-015599 | 2/2005 |
| WO | 2006-120005 | 11/2006 |
| WO | 2009-144727 | 12/2009 |

* cited by examiner

VIEW A

CHARGED PARTICLE DETECTION SYSTEM AND METHOD

CROSS-REFERENCE TO CO-PENDING APPLICATIONS

Applicant hereby claims priority benefit of U.S. Provisional Patent Application Ser. No. 61/180,876, filed on May 24, 2009, and titled "An Electron Detector Assembly," which is incorporated herein by reference in its entirety.

FIELD OF THE INVENTION

The present invention generally relates to a charged particle detection system, and in particular, to a charged particle detector assembly capable of detecting particles of different types, such as, positive and negative ions, secondary ions (SI) and secondary electrons (SE), backscattered ions (BSI) and backscattered electrons (BSE), tertiary ions (SI3) and tertiary electrons (SE3), sputtered ions, etc.

BACKGROUND OF THE INVENTION

Charged particle beam systems employed for inspection and/or imaging purposes typically generate a primary beam, of electrons or ions, which is focused onto the surface of a specimen by a charged particle beam column. The detection process generally involves the collection of secondary electrons, secondary ions, backscattered electrons and/or backscattered ions, which are emitted from the specimen surface as a result of the interaction of the primary charged particle beam with the specimen Additional detection configurations (as described in U.S. Pat. No. 7,417,235) disclose the detection of tertiary electrons and/or tertiary ions emitted from any surface within the detection system (other than the surface of the specimen) due to impingement of backscattered electrons and/or backscattered ions, neutral atoms or other particles thereon.

In order to inspect or form an image of the specimen, it is advantages to selectively detect charged particles produced due to operation of a charged particle beam column irradiating a specimen.

For example, a dual detector optics system for simultaneous collection of secondary and backscattered electrons is disclosed in U.S. Pat. No. 7,227,142. This detector optics system is a part of an electron probe system used for the testing of large substrates during manufacture. The design of the detector optics utilizes a field-free tunnel and substrate electric-field control electrodes to enable separation of the SEs and backscattered electrons into two detectors, allowing simultaneous acquisition of topographic and elemental composition data, with minimal impact on the electron probe.

It is generally desirable to reduce the number of detectors in any electron or ion beam system. Multiple detectors increase system cost and occupy space in the vacuum system, which may be needed for specimen manipulations. A detector capable of detecting secondary electrons, backscattered electrons, secondary ions and backscattered ions would therefore free space and significantly reduce manufacturing cost, provided the detector can distinguish between those particles by means of preferably automatic manipulation of voltages only, rather than mechanical adjustments or other direct operator intervention.

U.S. Pat. No. 7,417,235 describes a multi-purpose efficient charged particle detector that by switching bias voltages can detect either secondary ions, or secondary electrons from a specimen, or tertiary electrons that originate from backscattered electrons. The particle detector comprises a sparse collecting electrode; Venetian Blind strips for converting secondary ions to electrons disposed behind the sparse collecting electrode. The particle detector further comprises at least one further electrode adjacent the Venetian Blind strips and a scintillating disc for producing scintillation photons upon impingement of energetic electrons.

SUMMARY OF THE INVENTION

There is a need in the art and it would be advantageous to have a detection system with improved selectivity and detection efficiency for: secondary electrons and/or secondary ions emitted from the specimen, backscattered electrons and/or backscattered ions emitted from the specimen; and/or tertiary electrons and/or tertiary ions, which are emitted from a surface (defined as any surface other than the specimen) due to impingement of a backscattered electron, or a backscattered ion, or a neutral atom or any particle thereon.

The present invention satisfies the aforementioned need by providing a novel charged particle detection system for selectively detecting charged particles produced due to operation of a charged particle beam column irradiating a specimen. The system comprises a proximal grid, a distal grid spaced apart from the proximal grid and separated therefrom by a gap, and a charged particle detector configured for detecting the selected particles exiting from the distal grid and/or from the vicinity of the distal grid and impinging on the detector. It should be noted that in the description and claims that follow, the terms "proximal" and "distal" are used with reference to the specimen irradiated by a charged particle beam column.

The proximal grid is selectively electrically biasable and configured for controllably directing the charged particles emitted from the specimen by electrically focusing the charged particles to urge or compel the selected particles to propagate through the proximal grid and/or in the vicinity of the proximal grid and to repel unselected particles therefrom. The distal grid is selectively electrically biasable and configured for attracting the selected particles thereto and for urging or compelling the selected particles to enter the distal grid to propagate therethrough and/or to propagate in the vicinity of the proximal grid and to repel unselected particles therefrom.

There is thus provided in accordance with an embodiment of the present invention a charged particle detection system for selectively detecting charged particles produced due to operation of a charged particle beam column irradiating a specimen, including a proximal grid being selectively electrically biasable and configured for controllably directing the charged particles by electrically focusing the charged particles to compel selected secondary charged particles, whereupon being selected from the charged particles, to be attracted thereto, and to repel unselected secondary charged particles therefrom, a distal grid spaced apart from the proximal grid and separated therefrom by a gap, the distal grid being selectively electrically biasable and configured for attracting the selected secondary charged particles and/or selected tertiary charged particles, whereupon being selected from the charged particles, to the distal grid, and to repel unselected tertiary charged particles therefrom, and a charged particle detector configured for detecting the selected secondary charged particles attracted to the proximal grid and/or the distal grid and for detecting the selected tertiary charged particles attracted to the distal grid, that impinge thereupon.

According to an embodiment of the present invention the charged particles include at least the selected and unselected secondary charged particles and the selected and unselected tertiary charged particles, wherein the selected and unselected secondary charged particles include at least one of: secondary electrons and secondary ions, and the selected and unselected tertiary charged particles include at least one of: tertiary electrons and tertiary ions. Additionally, the proximal grid is configured for compelling the selected secondary charged particles to enter the proximal grid, and to propagate therethrough or in proximity to the proximal grid without entering therein. Moreover, the distal grid is configured for compelling the selected secondary charged particles and/or tertiary charged particles to enter the distal grid, and to propagate therethrough or in proximity to the distal grid without entering therein.

According to another embodiment of the present invention the charged particle detector is selected from the group consisting of a Microchannel-Plate (MCP), an electron multiplier detector, a solid state detector, an avalanche photo diode, a PIN diode, a PN diode, a NP diode, a silicon drift diode, a silicon photomultiplier and a scintillator element surface configured for producing scintillation photons upon impingement of the selected secondary and/or tertiary charged particles thereon.

According to yet another embodiment of the present invention the proximal grid includes a proximal grid circumferential surface including surface openings for allowing penetration of the selected secondary charged particles therein, and a proximal grid aperture defined by an opening of the proximal grid being most proximal to the specimen at a proximal end of the proximal grid, the proximal grid aperture configured to allow the selected secondary charged particles emitted from the specimen to enter the proximal grid for propagation therethrough. Additionally, the proximal grid includes an array of proximal grid rings electrically connected to each other and spaced apart from each other along a longitudinal axis of the charged particle detection system to define proximal grid gaps therebetween so as to allow penetration of the selected secondary charged particles therein, and a proximal grid aperture defined by an opening of a ring being most proximal to the specimen at a proximal end of the proximal grid, the proximal grid aperture configured to allow the selected secondary charged particles emitted from the specimen to enter the proximal grid for propagation therethrough.

According to still another embodiment of the present invention a radial dimension of the circumferential surface increases from a proximal end of the proximal grid towards a distal end thereof, thereby defining a tapered conical circumferential surface of the proximal grid. Additionally, the system further includes a guiding element electrically coupled to the proximal grid and configured for guiding and directing at least the selected secondary charged particles towards the proximal grid. Moreover, the guiding element includes a generally planar rectangular shaped frame connected to the proximal grid, at a proximal end of the proximal grid, for attracting the selected secondary charged particles thereto, the frame having an aperture so as to allow the selected secondary charged particles to enter the guiding element and the proximal grid for propagating therethrough. Furthermore, the frame is configured to generate an electrical field substantially uniform along an axis perpendicular to a plane in which the specimen is located.

According to a further embodiment of the present invention the system further includes an insulator ring arranged in the gap between the proximal grid and the distal grid. Additionally, the charged particle beam column includes at least one element selected from the group consisting of a focused ion beam (FIB) column, an electron beam column, a helium beam column and a dual beam column including a FIB column and an electron beam column. Additionally, the distal grid includes a distal grid circumferential surface including surface openings for allowing penetration of the selected secondary charged particles and/or the selected charged tertiary particles therein, and a distal grid aperture at a proximal end of the distal grid defined by an opening of the distal grid being most proximal to the proximal grid, the aperture configured to allow the selected secondary charged particles exiting from the proximal grid to enter the distal grid and/or the selected charged tertiary particles for propagation therethrough.

According to yet a further embodiment of the present invention the distal grid includes an array of distal grid rings electrically connected to each other and spaced apart from each other along a longitudinal axis of the charged particle detection system to define distal grid gaps therebetween so as to allow penetration of the selected secondary charged particles and/or the selected tertiary charged particles therein, and a distal grid aperture at a proximal end of the distal grid defined by an opening of a ring being most proximal to the proximal grid, the distal grid aperture configured to allow the selected secondary charged particles exiting from the proximal grid to enter the distal grid and/or the selected tertiary charged particles for propagation therethrough.

According to still a further embodiment of the present invention a radial dimension of the distal grid circumferential surface increases from a proximal end of the distal grid towards a distal end thereof, thereby defining a tapered conical circumferential surface of the distal grid. Additionally, the distal grid includes a circumferential surface configured as a lattice including interstices therebetween, so as to allow penetration of the selected secondary and/or tertiary charged particles therein. Alternatively, the distal grid includes a circumferential surface formed with a substantially solid surface including a plurality of apertures, so as to allow penetration of the selected secondary and/or tertiary charged particles therein. Moreover, the proximal grid includes a circumferential surface configured as a lattice including interstices therebetween, so as to allow penetration of the selected secondary charged particles therein.

According to another embodiment of the present invention the system further includes an internal distal grid arranged within the distal grid and configured for facilitation of propagation of the selected secondary and/or tertiary charged particles through the distal grid, the internal distal grid being electrically coupled to a switchable high voltage power supply for electrical biasing thereof. Additionally, the proximal grid, the distal grid, and the scintillator element surface are each coupled to a switchable high voltage power supply for selective electrical biasing thereof. Moreover, the system further includes an ion-to-electron converter mounted in the vicinity of the specimen and configured for emitting an electron upon impingement of an ion thereon.

There is thus provided in accordance with another embodiment of the present invention a charged particle detection system for selectively detecting charged particles produced due to operation of a charged particle beam column irradiating a specimen, including a proximal grid being selectively electrically biasable and configured for controllably directing the charged particles by electrically focusing the charged particles to compel selected secondary charged particles, whereupon being selected from the charged particles, to be attracted thereto, and to repel unselected secondary charged particles therefrom, a guiding element electrically coupled to the proximal grid and configured for guiding and directing the selected secondary charged particles towards the proximal grid, a distal grid spaced apart from the proximal grid and separated therefrom by a gap, the distal grid being selectively electrically biasable and configured for attracting the selected secondary charged particles and/or selected tertiary charged particles, whereupon being selected from the charged particles, to the distal grid, and to repel unselected tertiary charged particles therefrom, and a charged particle detector configured for detecting the selected secondary charged particles attracted to the proximal grid and/or the distal grid and for detecting the selected tertiary charged particles attracted to the distal grid, that impinge thereupon.

According to another general aspect, the present invention provides a method for selectively detecting charged particles produced due to operation of a charged particle beam column irradiating a specimen. The method is carried out by the system described above, and comprises selectively electrically biasing the proximal grid and the distal grid of the charged particle detection system so as to urge or compel the selected type of particle to be accelerated to the charged particle detector, and to repel the unselected type of particle so as to prevent the unselected particle from being accelerated to the charged particle detector.

There is thus provided in accordance with yet another embodiment of the present invention a method for selectively detecting charged particles produced due to operation of a charged particle beam column irradiating a specimen, including providing the charged particle detection system, selectively electrically biasing the proximal grid and the distal grid of the charged particle detection system so as to compel the selected secondary charged particles and/or the selected tertiary charged particles to be accelerated to the charged particle detector, and to repel the unselected secondary charged particles and/or the unselected charged tertiary particles so as to prevent the unselected secondary charged particles and/or the unselected charged tertiary particles from being accelerated to the charged particle detector. Accordingly, the charged particle detector includes a scintillator element surface configured for producing scintillation photons upon impingement of the selected secondary charged particles and/or the selected tertiary charged particles, the method including selectively electrically biasing the scintillator element surface of the charged particle detection system. Additionally, selectively electrically biasing includes electrically biasing the proximal grid to a predetermined first positive potential, electrically biasing the distal grid to a predetermined negative potential and electrically biasing the scintillator element surface to a predetermined second positive potential, thereby attracting the selected secondary charged particles to the proximal grid and propagating them towards the scintillator element surface for detection thereof, whereas repelling the unselected tertiary charged particles from the distal grid. Accordingly, the method further includes the steps of mounting an internal distal grid within the distal grid, and electrically biasing the internal distal grid to a predetermined third positive potential, thereby facilitating propagation of the selected secondary charged particles to the scintillator element surface. Additionally, selectively electrically biasing includes electrically biasing the proximal grid to a predetermined negative potential, electrically biasing the distal grid to a predetermined first positive potential and electrically biasing the scintillator element surface to a predetermined second positive potential, thereby repelling the unselected secondary charged particles, whereas attracting the selected tertiary charged particles to the distal grid for propagating them towards the scintillator element surface for detection thereof. Alternatively, selectively electrically biasing includes electrically biasing the proximal grid to a predetermined first positive potential, electrically biasing the distal grid to a predetermined second positive potential and electrically biasing the scintillator element surface to a predetermined third positive potential, thereby attracting the selected secondary charged particles and the selected tertiary charged particles to the proximal grid and/or to the distal grid for propagating thereof towards the scintillator element surface for detection thereof.

There has thus been outlined, rather broadly, the more important features of the invention so that the detailed description thereof that follows hereinafter may be better understood, and the present contribution to the art may be better appreciated. Additional details and advantages of the invention will be set forth in the detailed description.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF THE INVENTION

Figure 1:
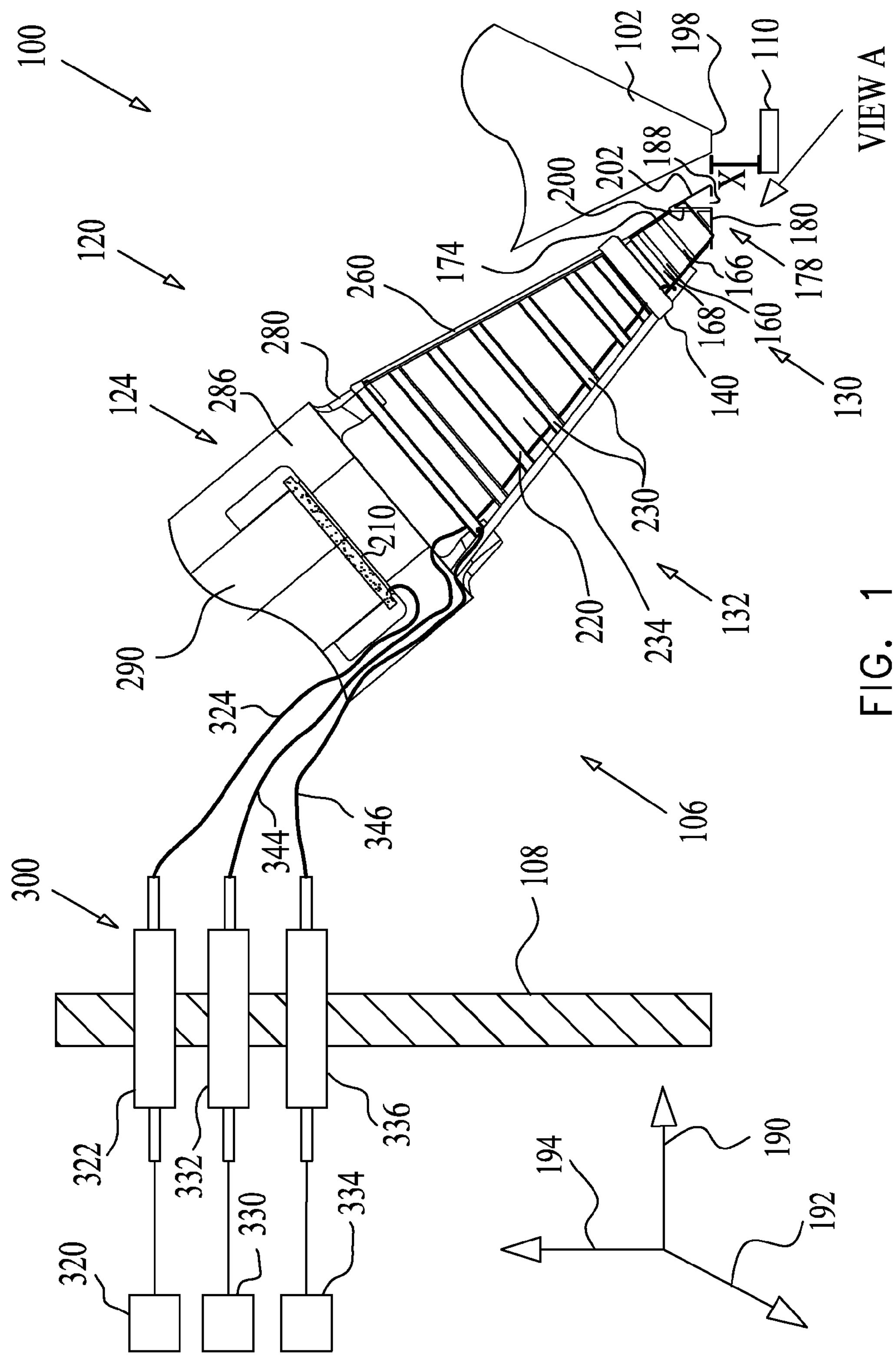
FIG. 1 is a simplified partially front view, partially sectional illustration of a charged particle detection system constructed and operative in accordance with an embodiment of the present invention.

As indicated above, the present invention is intended to be used with charged particle detection systems and the embodiments will therefore be described below with reference to this application. The principles of the charged particle detection systems according to the present invention may be better understood with reference to the drawings and the accompanying description, wherein similar reference numerals have been used throughout to designate identical elements. It should be understood that these drawings, which are not necessarily to scale, are given for illustrative purposes only and are not intended to limit the scope of the invention. Examples of constructions, materials, dimensions, and fabrication processes are provided for selected elements. Those versed in the art should appreciate that many of the examples provided have suitable alternatives which may be utilized.

For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Figure 2:
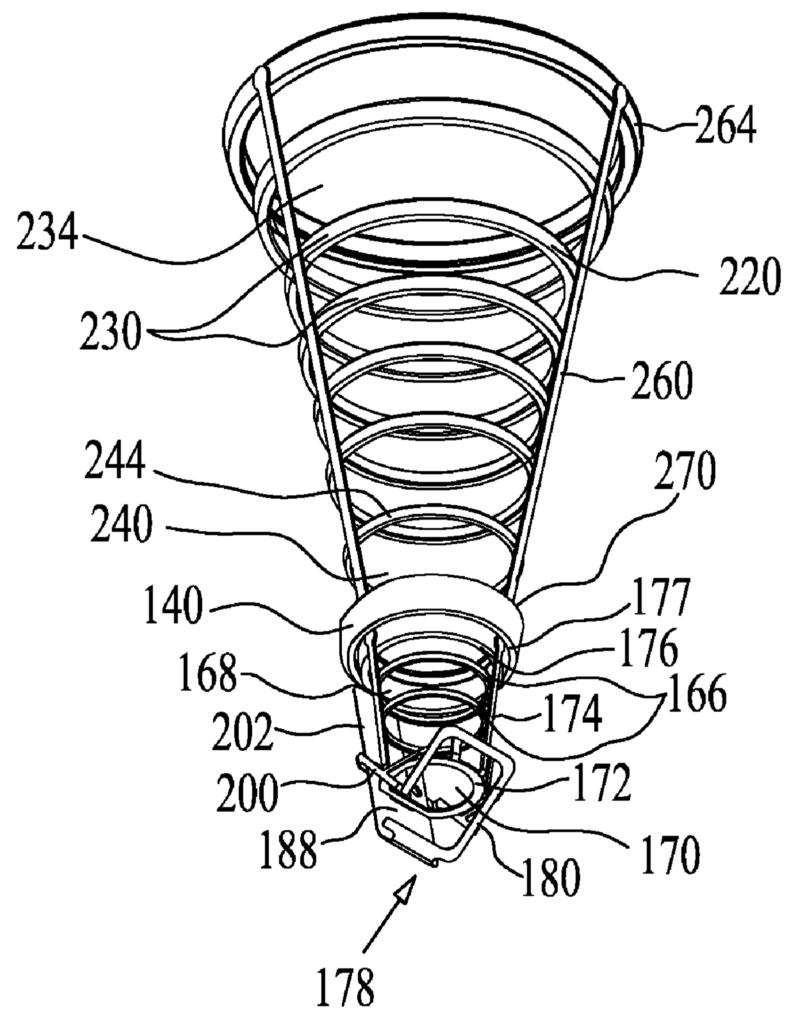
FIG. 2 is a simplified pictorial illustration of selected elements of the charged particle detection system of FIG. 1 shown in the orientation of arrow A in FIG. 1.

Referring to FIGS. 1 and 2 together, there is illustrated a charged particle detection system 100 according to an embodiment of the present invention. As seen in FIG. 1, the charged particle detection system 100 comprises a charged particle beam column 102 located within a detection system chamber 106 and defined by chamber walls 108. The charged particle beam column 102 is provided to emit a charged particle beam to irradiate a specimen 110 thus urging a particle to be emitted therefrom. The particle may be, inter alia, a neutral atom, a positive ion, a negative ion, a secondary ion, a sputtered ion, a backscattered ion, a secondary electron, or a backscattered electron. The beam column 102 may comprise a focused ion beam (FIB) column, an electron beam, a helium beam or any beam operative to irradiate a specimen. Additionally, a dual beam column, comprising a FIB or an electron beam, may be employed for emitting a charged particle beam to irradiate the specimen 110.

A charged particle detector assembly 120 is placed within the detection system chamber 106 and may comprise a charged particle detector subassembly 124 in electrical communication with a proximal grid 130 and a distal grid 132. The particle detector assembly 120 is provided to selectively detect particles emitted from the specimen 110 by selectively biasing the proximal grid 130 and the distal grid 132. The proximal grid 130 is in proximity to the specimen 110 relative to the distal grid 132, and the distal grid 132 is distal to the specimen 110. The proximal grid 130 and the distal grid 132 may be formed of any suitable electrically conductive material, such as stainless steel or aluminum, for example.

Figure 4:
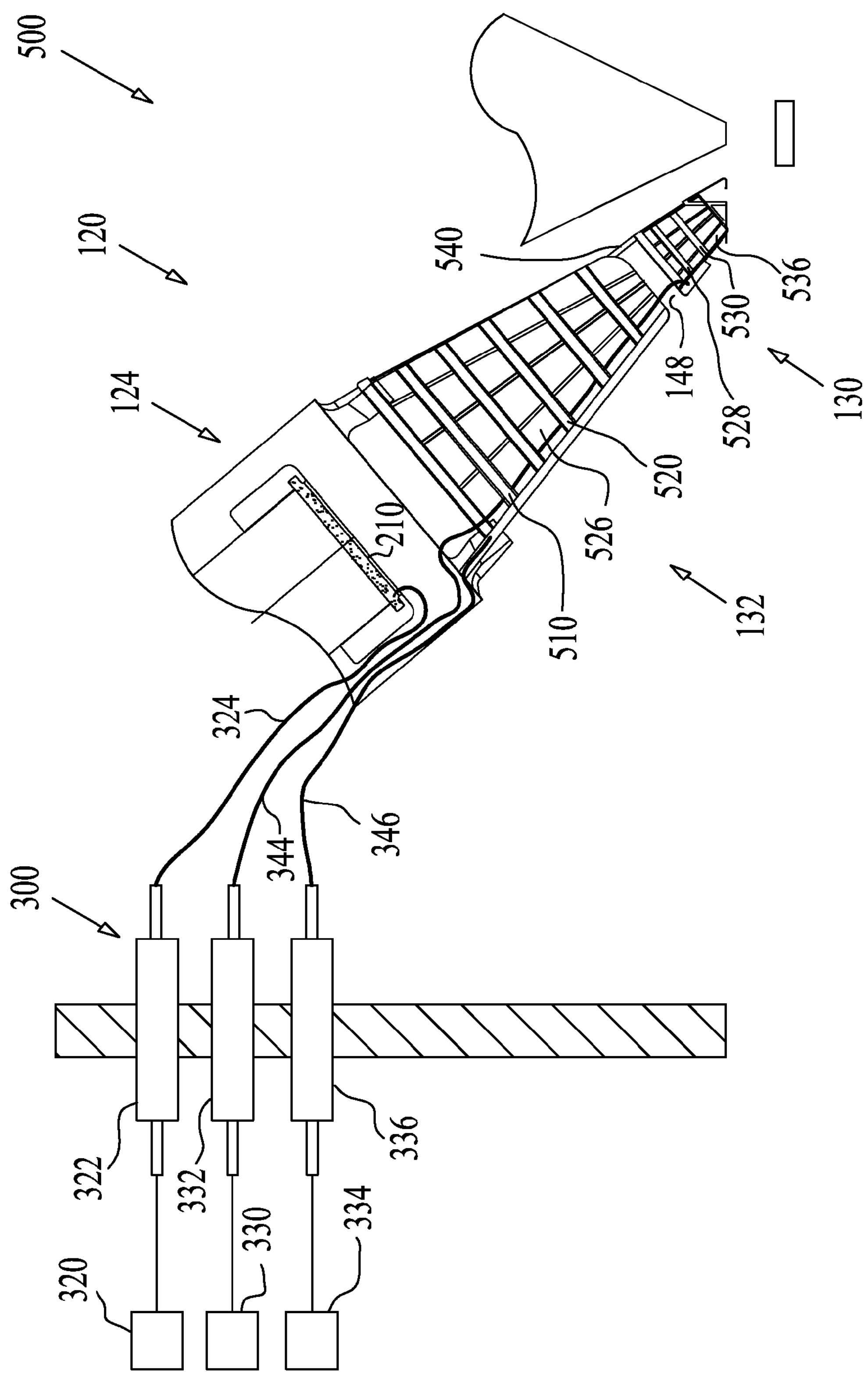
FIG. 4 is a simplified partially front view, partially sectional illustration of a charged particle detection system constructed and operative in accordance with yet another embodiment of the present invention.

Intermediate the proximal grid 130 and the distal grid 132 may be either a gap or an insulator. As shown in FIG. 1, the insulator can, for example, be formed as an insulator ring 140. The insulator ring 140 may be formed of any suitable electrically insulating material, such as any suitable ceramic material. In a non-limiting example, the ceramic material may be polyether ether ketone (PEEK). The insulator ring 140 may be formed in any suitable configuration. It is noted that the insulator ring 140 may be obviated, such as shown in FIG. 4 wherein the insulator ring 140 is obviated and replaced by a gap 148 intermediate the proximal grid 130 and the distal grid 132.

It is a particular feature of the present invention that the proximal grid 130 and the distal grid 132 may be electrically biased so as to selectively compel a selected type of particle to be accelerated to the particle detector subassembly 124 or repel an unselected type of particle so as to prevent the unselected particle from being accelerated to the particle detector subassembly 124, as will be further described hereinbelow with reference to FIGS. 8-10.

It is noted that the term "repel" as used throughout the description and the claims also includes not attracting the unselected particles to the proximal grid 130 or the distal grid 132, such as wherein the proximal grid 130 or the distal grid 132 are electrically biased to a zero or a relatively low voltage, such as a voltage of less than approximately 2V.

The selected or unselected types of particles may be, inter alia, electrons of the following types: secondary electrons (also designated as SE1) emitted from the specimen 110 due to interaction of the beam with the specimen 110; secondary electrons (also designated as SE2) emitted from the specimen 110 due to interaction of one of the following with the specimen 110: a sputtered ion, a sputtered neutral atom, a backscattered electron (BSE) or a backscattered ion (BSI); or tertiary electrons (also designated as SE3), which are emitted from a surface, defined as any surface other than the specimen, due to impingement of a BSE, or a BSI, or a neutral atom or any particle thereon.

The SE1 and SE2 are both characterized in the art as having relatively low energy levels of less than 50 eV and in accordance with an embodiment of the present invention the SE1 and SE2 are detected together indiscriminately and will therefore be referred to in the following description collectively as secondary electrons (SE). The BSE are characterized in the art as having a relatively high energy level of above than 50 eV. SE3 are characterized in the art as SE emitted not from the specimen but rather from any other surface which is not the specimen.

In accordance with an embodiment of the present invention the proximal grid 130 and the distal grid 132 may be electrically biased to achieve usually three detection modes: (i) a SE detection mode wherein mainly SE reach the particle detector subassembly 124 and are detected thereby, while most of the SE3 are repelled and do not reach the particle detector subassembly 124; (ii) a SE3 detection mode wherein mainly SE3 reach the particle detector subassembly 124 and are detected thereby while most of the SE are repelled and do not reach the particle detector subassembly 124; and (iii) a combined SE & SE3 mode wherein mainly SE and SE3 reach the particle detector subassembly 124 and are detected thereby.

Additionally, the selected or unselected types of particles may be ions, such as secondary ions (SI), BSI or sputtered ions emitted from the specimen 110 due to interaction of the beam with the specimen 110; or tertiary ions, also designated as SI3, which are emitted from a surface due to impingement of a BSE, or a BSI, or a neutral atom or any particle, thereon.

It is noted that the term "charged particles" as used throughout the description and the claims comprises at least secondary charged particles and tertiary charged particles, the term "secondary charged particles" includes at least one of the secondary electrons and secondary ions and the term "tertiary charged particles" includes at least one of the tertiary electrons and tertiary ions.

Figure 11:
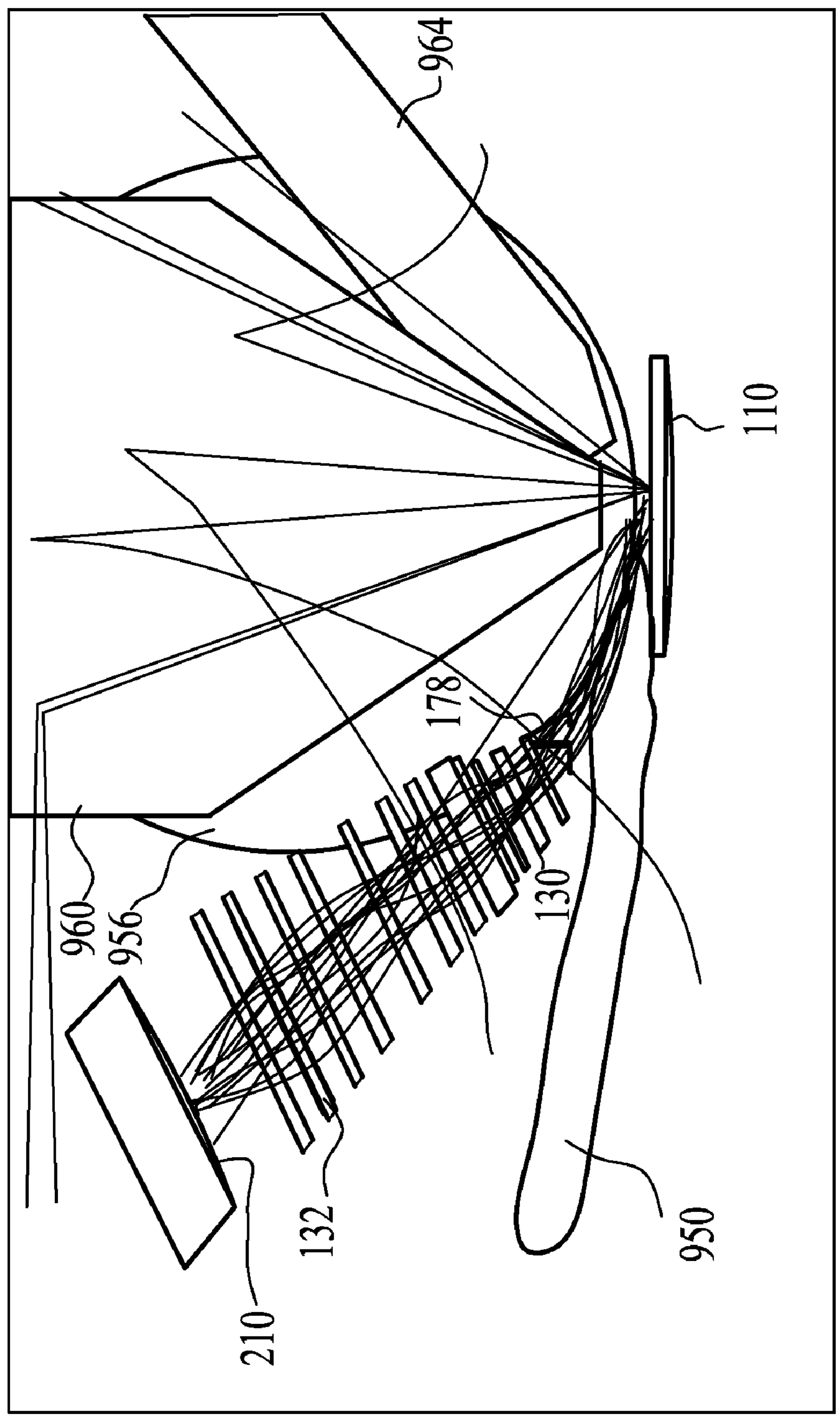
FIG. 11 is a simplified schematic illustration of a 2D simulation illustrating the operation of the charged particle detection system as shown in FIG. 8.
Figure 12:
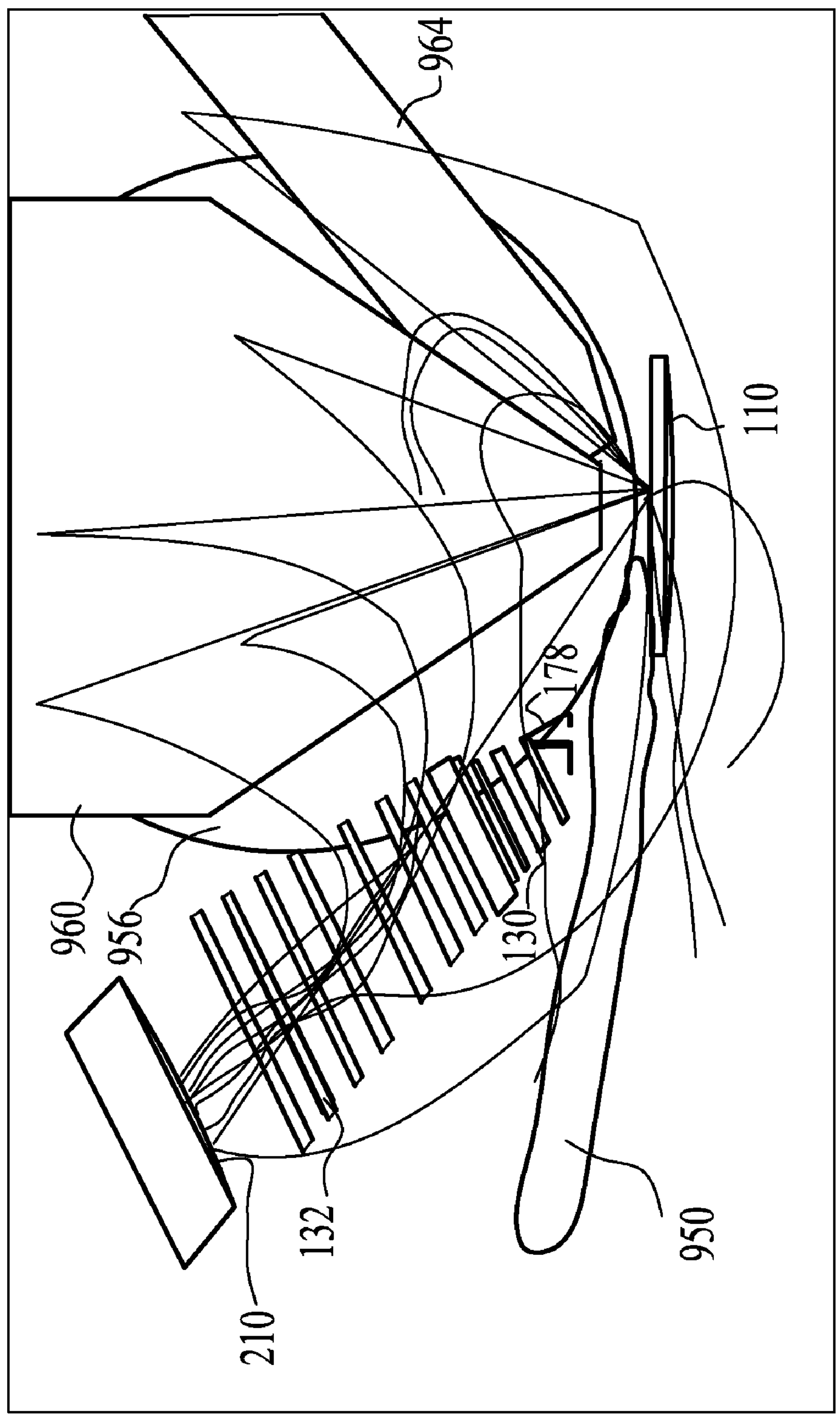
FIG. 12 is a simplified schematic illustration of a 2D simulation illustrating the operation of the charged particle detection system as shown in FIG. 9.
Figure 13:
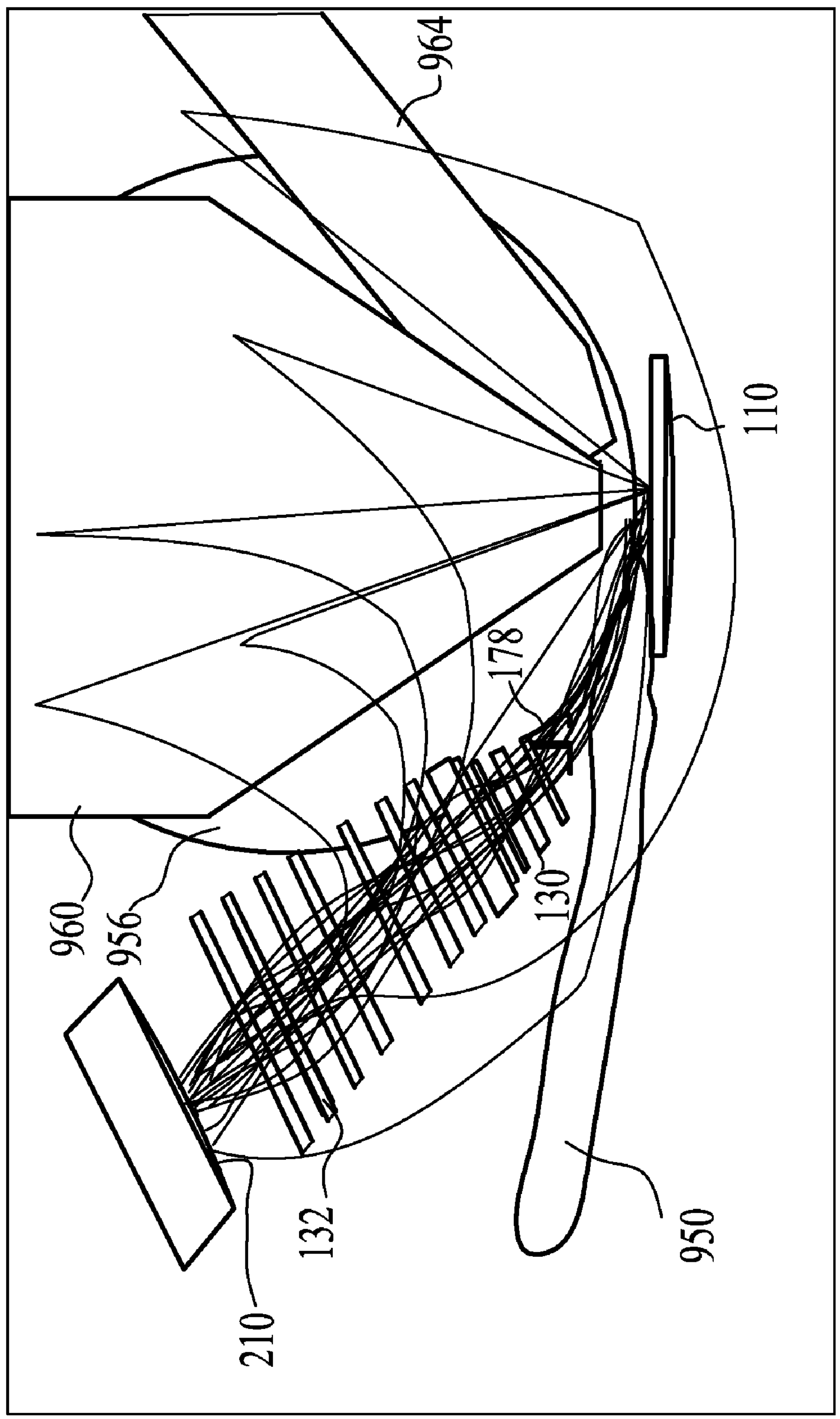
FIG. 13 is a simplified schematic illustration of a 2D simulation illustrating the operation of the charged particle detection system as shown in FIG. 10.

The impinged upon surface emitting SE3 or SI3 may, for example, be any surface within the detection system chamber 106 such as the wall 108, the beam column 102, a FIB column, an electron beam column, an additional detector, a micro-sampling unit or a gas nozzle (see, for example, FIGS. 11-13).

The proximal grid 130 may be configured in any suitable configuration for controllably directing a beam of the selected charged particles by electrically focusing the beam of the selected charged particles to be attracted to the proximal grid 130 and to compel the selected particles to enter the proximal grid 130 and propagate towards the distal grid 132, or to propagate in proximity to the proximal grid 130. The proximal grid 130 defines a circumferential surface 160 therearound. The circumferential surface 160 may be formed with apertures, openings or gaps so as to allow the selected particles to enter the proximal grid 130 with minimal absorption within the material of the proximal grid 130.

Additionally, the proximal grid 130 may be formed with an aperture defined by an opening of the proximal grid 130 being most proximal to the specimen 110 at a proximal end of the proximal grid 130. The proximal grid aperture is provided to allow the selected particles emitted from the specimen 110 to enter the proximal grid 130 for propagation therethrough.

As seen in FIGS. 1 and 2, the proximal grid 130 is formed with an array of rings 166 electrically connected to each other and spaced apart from each other along a longitudinal axis of the charged particle detection system 100 and defining gaps 168 therebetween. (It is noted that in FIG. 2 not all elements of the particle detection system 100 are shown, rather only a guiding element 178, the proximal grid 130 and the distal grid 132 are shown.) Thus it can be seen that the circumferential surface 160 is formed of the array of rings 166 with the gaps 168 therebetween so as to attract the selected particles thereto wherein the proximal grid 130 is selectively electrically biased. Additionally, an opening, namely a proximal grid aperture (170 in FIG. 2) may be defined by a lower ring 172 (i.e., the most proximal ring to the specimen 110) of the ring array 166, so as to allow the selected particles to enter the proximal grid 130 therethrough.

The ring array 166 may be affixed to one or more proximal grid rods 174 extending from the lower ring 172 to an upper ring 176 (the most distal ring to the specimen 110) thereof. The rods 174 are provided for supporting the ring array 166 and, when required, for mounting the proximal grid 130 to the insulator ring 140 at a lower portion 177 of the insulator ring 140. It is appreciated that the ring array 166 may be supported and mounted onto the insulator ring 140 in any suitable manner.

The proximal grid 130 may be formed with the guiding element 178 in electrical communication therewith. The guiding element 178 may be provided to aid in guiding and directing the selected particles towards the proximal grid 130. The guiding element 178 may be formed in any suitable shape for guiding and directing the selected particles towards the proximal grid 130.

As seen in FIG. 2, the guiding element 178 may be formed of a generally planar rectangular shaped frame 180. The frame 180 may be configured with an aperture 188 so as to allow the selected particles to enter the guiding element 178 and the proximal grid 130 therethrough. The guiding element 178 may be formed of any suitable electrically conductive material, such as stainless steel or aluminum, for example. The guiding element 178 may be positioned in any suitable position so as to attract the selected particles thereto. For example, as seen in FIG. 1 the frame 180 is located generally at a plane defined by a first axis 190 and a second axis 192 which is substantially the same plane the specimen 110 is located. Additionally, the frame 180 generally has the same longitudinal distance X from the specimen 110, along a third axis 194, that a lower surface 198 of the beam column 102 has from the specimen 110. Consequentially, an electrical field generated by the frame 180 is substantially uniform along the third axis 194 that is perpendicular to the plane in which the specimen 110 is located. Thus, the particles emitted by the specimen 110 are not attracted to a specific area on the frame 180, thereby allowing the selected particles to generally uniformly enter the guiding element 178, via the aperture 188.

The frame 180 may, for example, be connected to the proximal grid 130 via support bars 200 and may be mounted onto the proximal grid 130 by a mounting plate 202.

It is appreciated that the guiding element 178 may be mounted to the proximal grid 130 in any suitable manner. Additionally, the guiding element 178 may be physically disconnected from the proximal grid 130 while being in electrical communication with the proximal grid 130. In such an embodiment the guiding element 178 may be mounted on any suitable element within the chamber 106, such as on the wall 108 by a mounting element (not shown), for example.

The distal grid 132 may be configured in any configuration suitable to attract a selected particle thereto and to compel the selected particle to enter the distal grid 132 and propagate towards a scintillator element surface 210 or to propagate in proximity to the distal grid 132 towards the scintillator element surface 210. The distal grid 132 defines a circumferential surface 220 therearound. The circumferential surface 220 may be formed with apertures, openings or gaps so as to allow the selected particles to enter the distal grid 132 with minimal absorption within the material of the distal grid 132. Additionally, the distal grid 132 may be formed with an aperture defined by an opening of the distal grid 132 being most proximal to the proximal grid 130 at a proximal end of the distal grid 132. The distal grid aperture is provided to allow the selected particles emitted from the proximal grid 130 to enter the distal grid 132 for propagation therethrough.

As seen in FIGS. 1 and 2, the distal grid 132 is formed with an array of distal grid rings 230 electrically connected to each other and spaced apart from each other along the longitudinal axis of the charged particle detection system 100 and defining gaps 234 therebetween. Thus it can be seen that the circumferential surface 220 is defined by the array of rings 230 with the gaps 234 therebetween so as to attract the selected particles thereto wherein the distal grid 132 is selectively electrically biased.

Additionally, a distal grid opening, namely an aperture 240, may be defined at a lower ring 244 of the distal grid 132 so as to allow the selected particle enter the distal grid 132 therethrough, such as wherein the selected particle propagates from the proximal grid 130.

The ring array 230 may be affixed to rods 260 extending from the lower ring 244 to an upper ring 264 thereof. The rods 260 are provided for supporting the ring array 230 and for mounting the distal ring 132 onto the insulator ring 140 at an upper portion 270 of the insulator ring 140. It is appreciated that the ring array 230 may be supported and mounted onto the insulator ring 140 in any suitable manner.

The circumferential surface 160 of proximal grid 130 and the circumferential surface 220 of distal grid 132 may each be formed in any suitable configuration. As seen in FIGS. 1 and 2 the circumferential surfaces 160 and 220 are formed as a generally tapered conical surface wherein a radial dimension of the circumferential surfaces 160 and 220 increases from a proximal end of the proximal grid 130, such as the lower ring 172 of the proximal grid 130, towards a distal end, such as the upper ring 264 of the distal grid 132, thereby defining a tapered conical circumferential surface of the circumferential surfaces 160 and 220. The circumferential surfaces 160 and 220 are formed as a generally tapered conical surface so as to be readily placed and, namely, fit within the detection system chamber 106 amongst other chamber elements comprised within the detection system chamber 106, such as a FIB, an electron beam column or a gas nozzle (FIGS. 11-13), for example.

Figure 3:
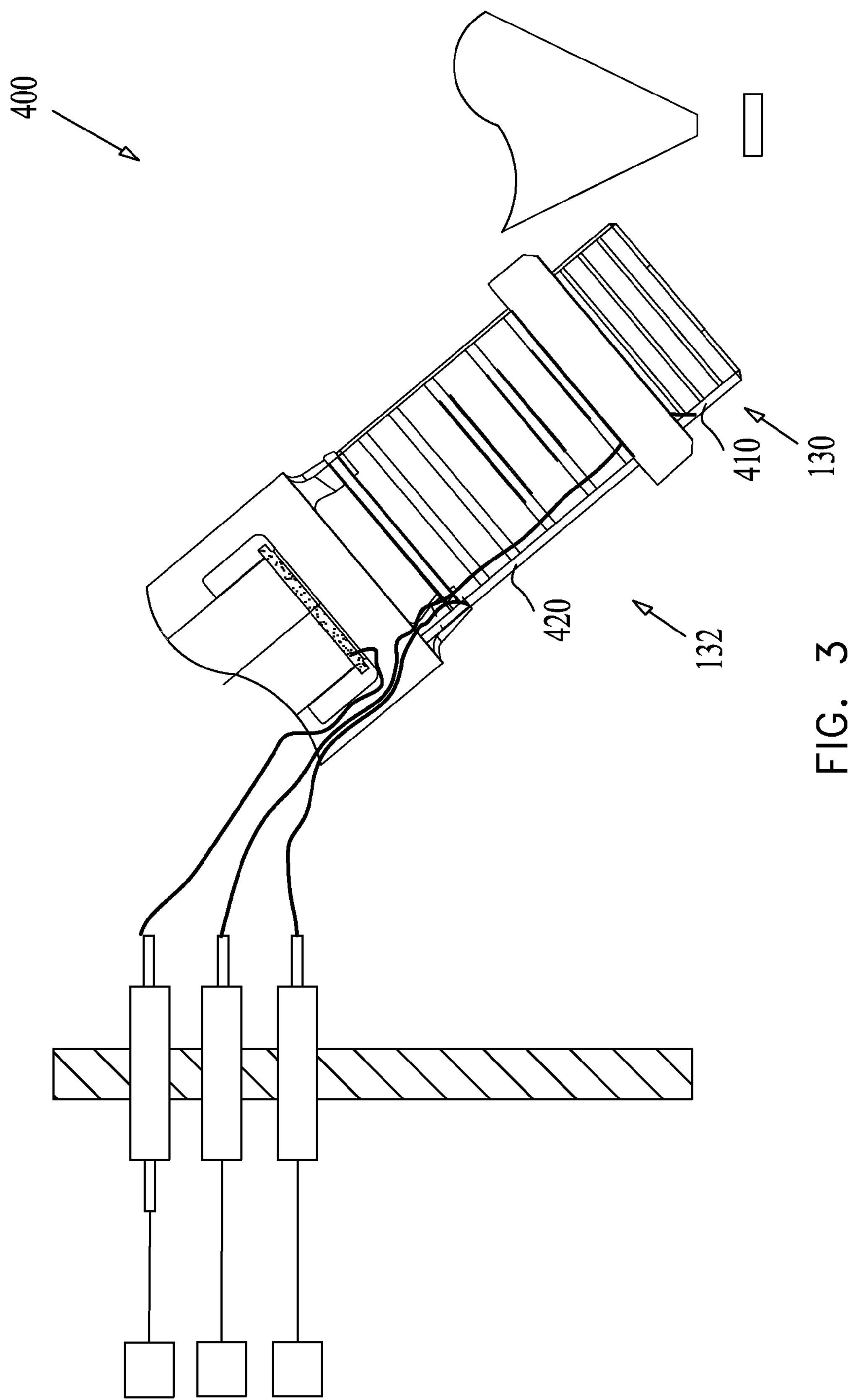
FIG. 3 is a simplified partially front view, partially sectional illustration of a charged particle detection system constructed and operative in accordance with another embodiment of the present invention.

It is appreciated that the circumferential surfaces 160 and 220 may each be configured in any suitable shape, such as a cylindrical shape, for example, as shown in FIG. 3.

Figure 5:
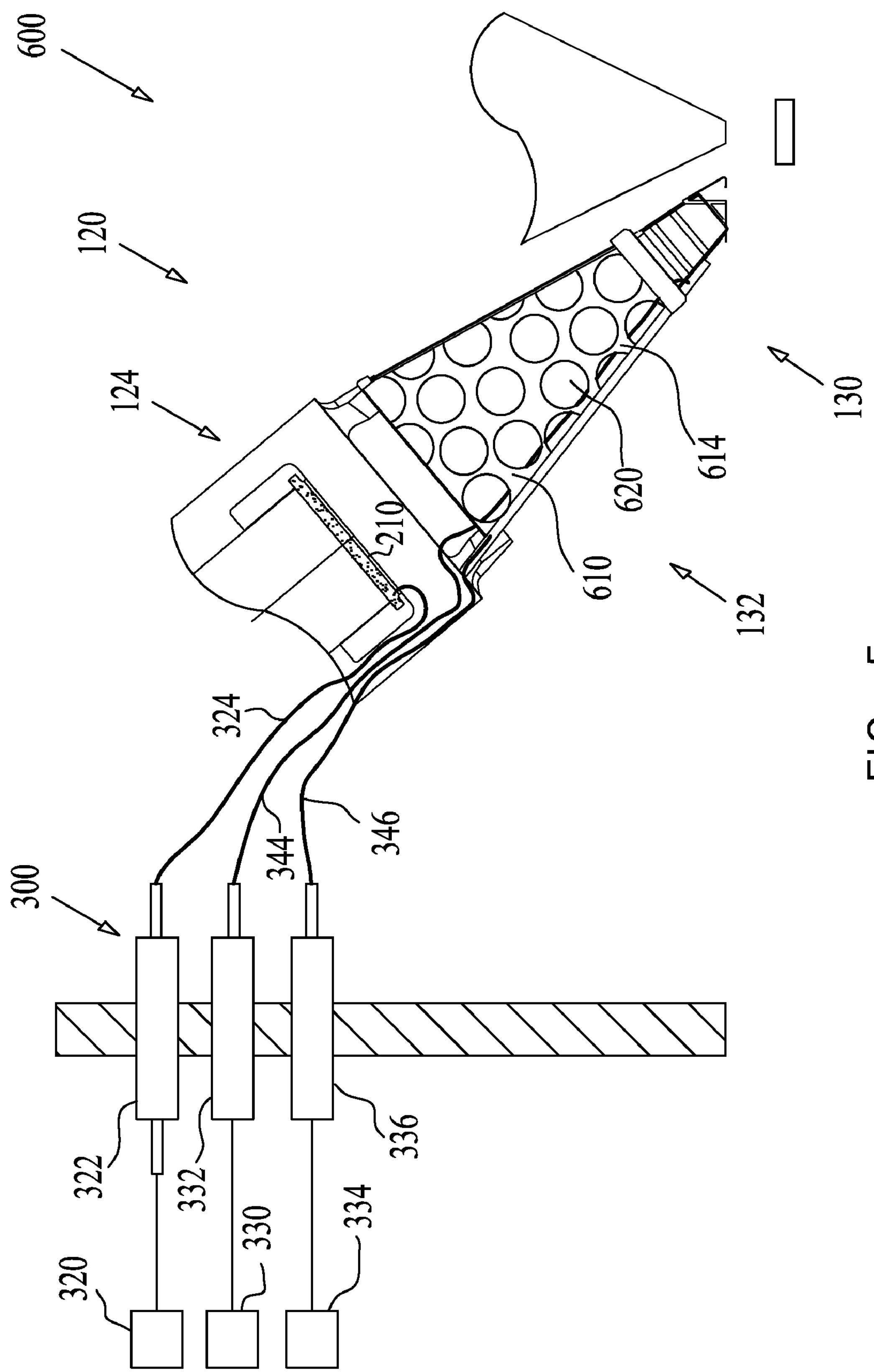
FIG. 5 is a simplified partially front view, partially sectional illustration of a charged particle detection system constructed and operative in accordance with still another embodiment of the present invention.
Figure 6:
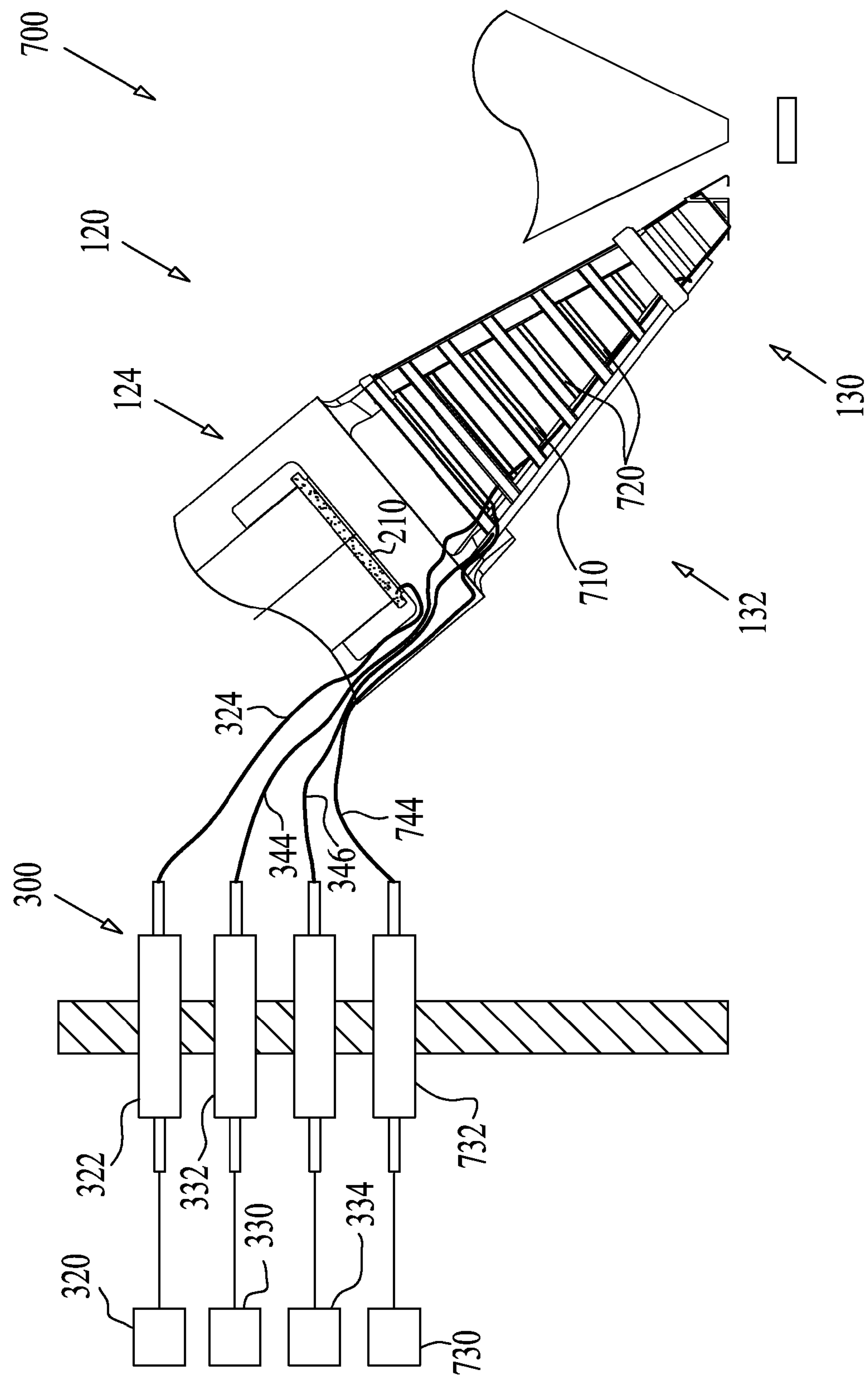
FIG. 6 is a simplified partially front view, partially sectional illustration of a charged particle detection system constructed and operative in accordance with a further embodiment of the present invention.

It is further appreciated that the circumferential surfaces 160 and 220 may comprise any suitable configuration, such as a plurality of rods, a solid surface, a perforated surface, a helical wire, a lattice, for example, some of which are shown in FIGS. 4-6.

The distal grid 132 is in electrical communication with the particle detector subassembly 124 and may be mounted thereto by mounting elements 280. The mounting elements 280 may be formed of any suitable material, typically an electrically insulating material, such as any suitable ceramic material. The distal grid 132 may be mounted to the particle detector subassembly 124 by any suitable means. Additionally, the distal grid 132 may be physically disconnected from the particle detector subassembly 124 while being in electrical communication with the distal grid 132. In such an embodiment the distal grid 132 may be mounted on any suitable element within the chamber 106, such as on the wall 108 by a mounting element (not shown), for example.

The particle detector subassembly 124 is provided to detect particles impinging thereupon and yield an electrical signal therefrom. Typically, the particle detector subassembly 124 comprises a housing 286 including the scintillator element surface 210, which may be coupled to a light sensor, such as a photomultiplier tube (PMT) (not shown) via a light guide 290 thereby yielding an electrical signal from a particle impinging upon the scintillator element surface 210. It is appreciated that any apparatus for detecting particles or photons may be employed. For example, a Microchannel-Plate (MCP), a solid state detector, an avalanche photo diode, a PIN diode, a PN diode, a NP diode, a silicon drift diode, or a silicon photomultiplier, may be employed. Alternatively, an Electron Multiplier detector may be employed, such as a CHANNELTRON® detector, which may be commercially available at Burle Industries, Inc. of 1000 New Holland Avenue, Lancaster, Pa. 17601-5688 U.S.

It is appreciated that the charged particle detector subassembly 124 may be placed partially within the detection system chamber 106, namely, the vacuum chamber of the charged particle detection system 100. Alternatively, the charged particle detector subassembly 124 may be fully placed within the detection system chamber 106, namely, the vacuum chamber of the charged particle detection system 100. For example, the scintillator element surface 210, the light guide 290 and the PMT may all be placed within the detection system chamber 106, namely, the vacuum chamber of the charged particle detection system 100.

The housing 286 may be formed of any suitable material such as an electrically conductive material, typically stainless steel or aluminum, for example. The housing 286 may be shaped in any suitable shape, such as a cylindrical shape, as shown in FIG. 1, it being appreciated that the housing 286 may be formed in any suitable shape.

The proximal grid 130, the distal grid 132 and the scintillator element surface 210 are selectively electrically biased so as to create an electric field capable of urging or compelling a selected particle emitted from the specimen 110 to pass through or in proximity to the proximal grid 130 and the distal grid 132 on to the scintillator element surface 210 so as to be detected thereby. It is appreciated that the proximal grid 130, the distal grid 132 and the scintillator element surface 210 may be electrically biased in any suitable manner.

A control unit, namely an electric field generator, operates to create an appropriate electric field to direct the selected particles to the scintillator element surface 210. In the embodiment shown in FIG. 1, an electrical biasing assembly 300 of the control unit comprises a tunable positive power supply or a switchable high voltage power supply 320 coupled to a first voltage feedthrough 322. The first voltage feedthrough 322 may be in electrical communication with the scintillator element surface 210, via an electrical wire 324 or by any other suitable means, so as to electrically bias the scintillator element surface 210. A switchable high voltage bipolar power supply 330 may be coupled to a second voltage feedthrough 332 and an additional switchable high voltage bipolar power supply 334 may be coupled to a third voltage feedthrough 336. The second voltage feedthrough 332 is in electrical communication with the distal grid 132 via an electrical wire 344 or by any other suitable means, so as to electrically bias the distal grid 132. The third voltage feedthrough 336 is in electrical communication with the proximal grid 130 via an electrical wire 346 or by any other suitable means, so as to electrically bias the proximal grid 130.

It is appreciated that the electrical biasing assembly 300 may be configured in any suitable configuration. For example, a plurality or a single voltage power supply may be provided. The control unit may be located within the particle detection system 100 or may be located externally to the particle detection system 100 and is in electrical communication therewith. Additionally, the voltage power supply may be located within the particle detection system 100 or may be located externally to the particle detection system 100 and is in electrical communication therewith.

When desired, a voltage divider (not shown) may be included for dividing the voltage supplied by a voltage power supply to at least two voltage feedthroughs. Moreover, the electrical wires 324, 344 and 346 may be placed in any suitable location within the particle detection system 100. For example, the electrical wires may be engaged with a flange (not shown).

Referring to FIG. 3, a particle detection system 400 is shown. The particle detection system 400 is substantially similar to the particle detection system 100 of FIGS. 1 and 2 albeit a circumferential surface 410 of the proximal grid 130 and a circumferential surface 420 of the distal grid 132 are each formed in a cylindrical shape, it being appreciated that any suitable shape may be provided.

Additionally, in the embodiment shown in FIG. 3 the guiding element 178 of FIGS. 1 and 2 is obviated. In this embodiment, the selected particles can directly enter the proximal grid 130.

Referring to FIG. 4, a particle detection system 500 is shown. The particle detection system 500 is substantially similar to the particle detection system 100 of FIGS. 1 and 2 albeit a circumferential surface 510 of the distal grid 132 is configured as a lattice 520 with interstices 526 therebetween so as to allow a particle therein.

Moreover, a circumferential surface 528 of the proximal grid 130 is configured as a lattice 530 with interstices 536 therebetween so as to allow a particle therein. It is appreciated that any suitable configuration may be provided Additionally, the insulator ring 140 of FIGS. 1 and 2 is obviated and is replaced by the gap 148 intermediate the proximal grid 130 and the distal grid 132. The proximal grid 130 may be mounted onto the distal grid 132 by any suitable means, such as by a mounting element 540. It is noted that the distal grid 132 may be physically disconnected from the proximal grid 130. In such an embodiment the proximal grid 130 may be mounted on any suitable element within the chamber 106, such as onto the wall 108 by a mounting element (not shown), for example.

Referring to FIG. 5, a particle detection system 600 is shown. The particle detection system 600 is substantially similar to the particle detection system 100 of FIGS. 1 and 2 albeit a circumferential surface 610 of the distal grid 132 is formed with a substantially solid surface 614 formed with a plurality of apertures 620 so as to allow a particle therein. It is appreciated that any suitable configuration may be provided.

Referring to FIG. 6, a particle detection system 700 is shown. The particle detection system 700 is substantially similar to the particle detection system 100 of FIGS. 1 and 2. An additional internal distal grid 710 is suspended (i.e., arranged) within the distal grid 132.

The internal distal grid 710 is configured for facilitation of propagation of charged particles through the distal grid 132, as will be further described in reference to FIG. 8 hereinbelow.

In the embodiment shown in FIG. 6 the internal distal grid 710 comprises an array of rings 720, it being appreciated that the internal distal grid 710 may comprise any suitable configuration.

The control unit may comprise an additional switchable high voltage bipolar power supply 730 which may be coupled to an additional voltage feedthrough 732. The voltage feedthrough 732 is in electrical communication with the internal distal grid 710 via an electrical wire 744 or by any other suitable means, so as to electrically bias the internal distal grid 710.

It is noted that an additional internal grid (not shown) may be suspended within the proximal grid 130.

Figure 7:
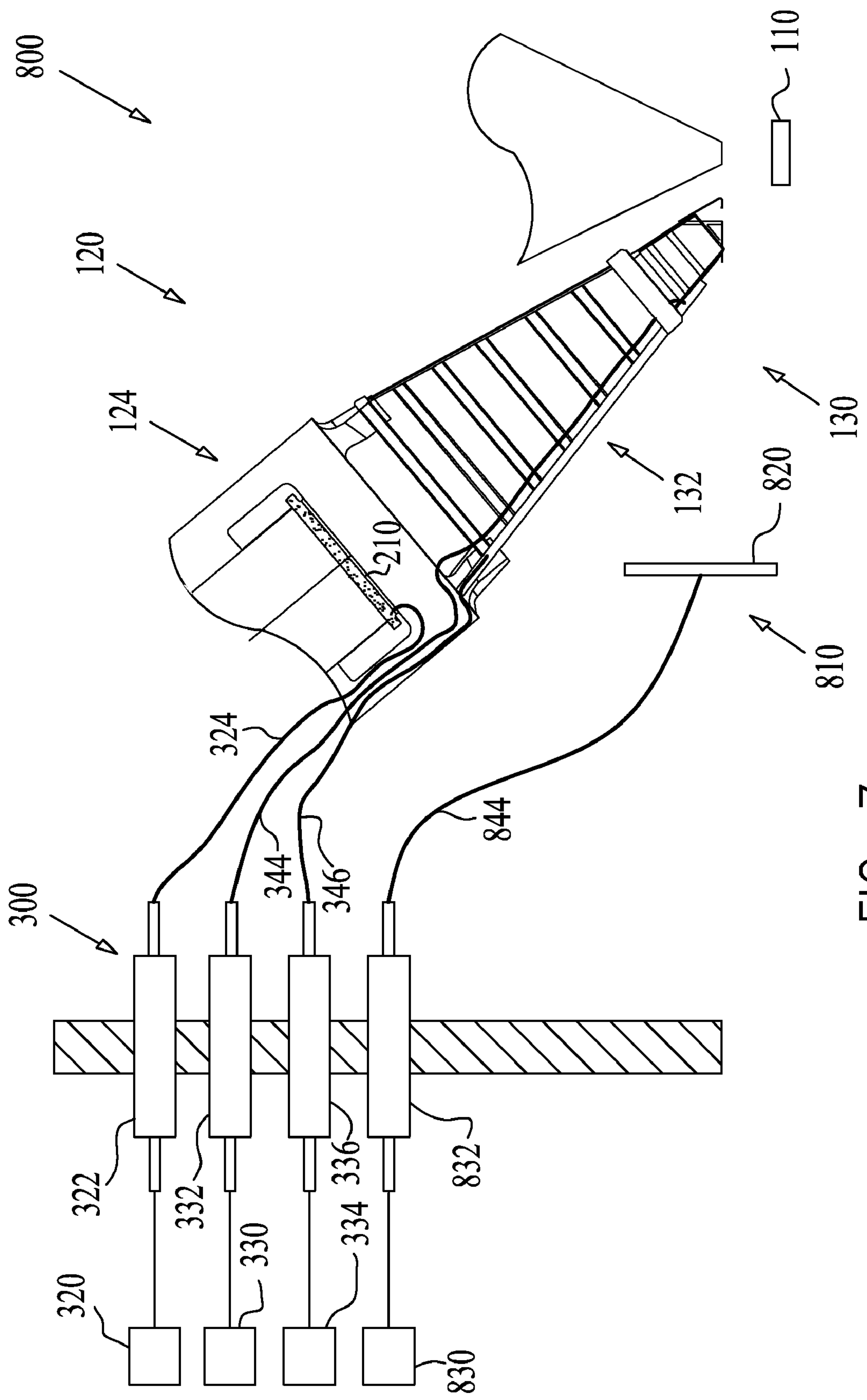
FIG. 7 is a simplified partially front view, partially sectional illustration of a charged particle detection system constructed and operative in accordance with yet a further embodiment of the present invention.

Referring to FIG. 7, a particle detection system 800 is shown. The particle detection system 800 is substantially similar to the particle detection system 100 of FIGS. 1 and 2. An ion to electron convertor 810 may be provided and is operative to emit an electron upon impingement of an ion thereon in any suitable manner. As seen in FIG. 7, the convertor 810 may comprise a conversion surface 820 formed of any suitable material, typically a material for allowing high electron emission therefrom, such as aluminum, for example.

It is noted that additional particles, such as a neutral atom or a BSE, may impinge upon the convertor 810 causing electrons to be emitted therefrom.

The control unit may comprise an additional switchable high voltage power supply 830 which may be coupled to an additional voltage feedthrough 832. The voltage feedthrough 832 is in electrical communication with the convertor 810 via an electrical wire 844 or by any other suitable means. The convertor 810 is thus electrically biased so as to attract or accelerate ions thereto. The attracted or accelerated ions impinge upon the conversion surface 820 which in turn emits resultant electrons therefrom.

It is noted that the convertor 810 may be placed in any suitable location within the detection system chamber 106. Additionally, the convertor 810 may be placed within the particle detector assembly 120.

In accordance with an embodiment of the present invention the particle detection systems of FIGS. 1-7 may be employed to selectively detect specific types of particles emitted from the specimen 110. This may be achieved by selectively electrically biasing the proximal grid 130 and the distal grid 132 so as to compel a selected particle to be accelerated to the particle detector subassembly 124 and to repel an unselected particle so as to prevent the unselected particle from being accelerated to the particle detector subassembly 124.

Figure 8:
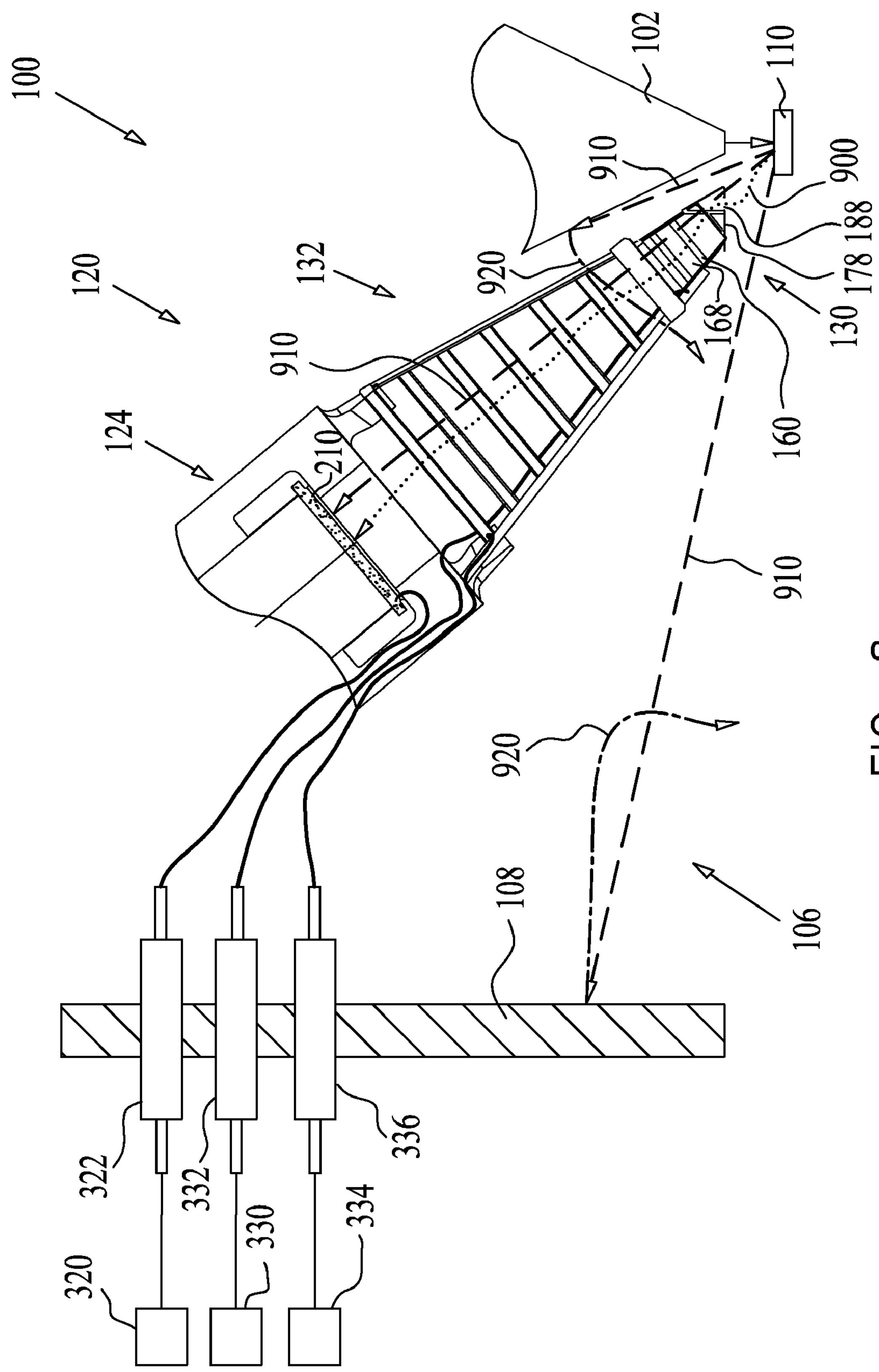
FIG. 8 is a simplified operational illustration of the charged particle detection system of FIG. 1, constructed and operative in accordance with an embodiment of the present invention.
Figure 9:
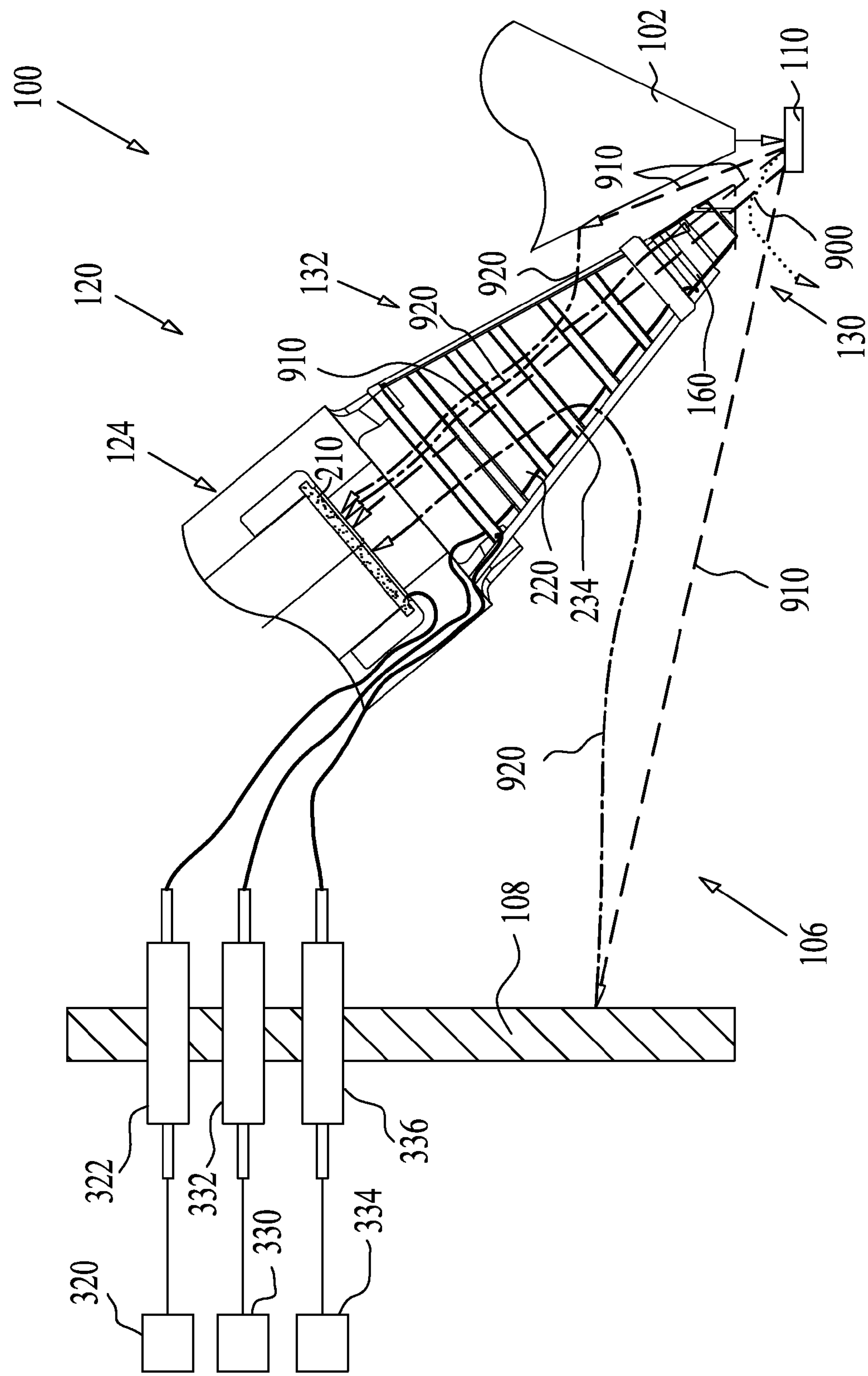
FIG. 9 is a simplified operational illustration of the charged particle detection system of FIG. 1, constructed and operative in accordance with another embodiment of the present invention.
Figure 10:
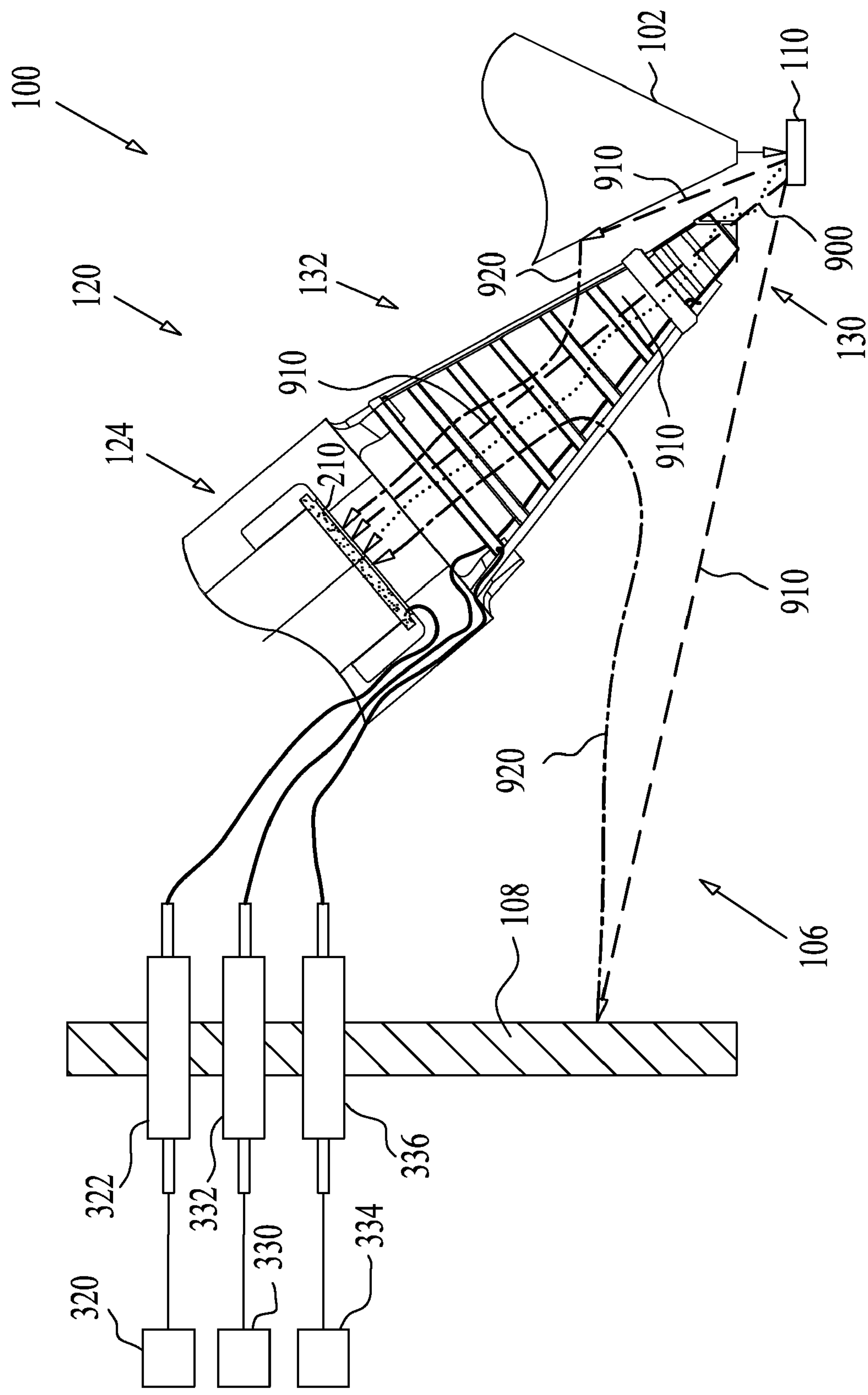
FIG. 10 is a simplified operational illustration of the charged particle detection system of FIG. 1, constructed and operative in accordance with yet another embodiment of the present invention.

Referring to FIGS. 8-10, three electron detection modes are shown employing the particle detection system 100 of FIG. 1. In FIG. 8 the SE detection mode is illustrated, in FIG. 9 the SE3 detection mode is illustrated and in FIG. 10 the SE&SE3 detection mode is illustrated.

Turning to FIG. 8, the proximal grid 130 is electrically biased to a positive electrical potential and the distal grid 132 is electrically biased to a negative electrical potential or to a zero electrical potential. A SE 900 emitted from specimen 110 is attracted to the positively electrically biased proximal grid 130 and may enter therein via the aperture 188 of the guiding element 178 or via the gaps 168 of the circumferential surface 160 of the proximal grid 130. Additionally, the SE may propagate in proximity to the proximal grid 130. The SE 900 thereafter passes through or in proximity to the negatively biased distal grid 132 and impinges upon the scintillator element surface 210 so as to yield an electrical signal therefrom and thereby detect the SE 900. A BSE 910 emitted from the specimen 110 is shown to impinge upon the particle beam column 102 and thus a resultant SE3 920 is emitted from the particle beam column 102. The SE3 920 is repelled by the negatively biased distal grid 132. Alternatively, the SE3 may be absorbed within the particle column beam 102 or within the proximal grid 130 or within other chamber elements.

Additionally, the BSE 910 may be emitted from the specimen 110 and impinge upon any other surface within the system chamber 106, such as the wall 108, thus causing a resultant SE3 920 to be emitted from the wall 108. The SE3 920 is repelled by the distal grid 132. Alternatively the SE3 may be absorbed within the wall 108 or within the distal grid 132 or within other chamber elements.

Furthermore, a BSE 910 may be emitted from the specimen 110 and propagate towards the scintillator element surface 210 and impinge thereupon.

In a non-limiting example the proximal grid 130 is biased to +200V, the distal grid is biased to −20V and the scintillator element surface 210 is biased to +10 kV.

It is noted that the particle detection system 700 of FIG. 6 may be employed for detecting SE in the SE detection mode. As described hereinabove in reference to FIG. 8, the proximal grid 130 is electrically biased to a positive electrical potential and the distal grid 132 is electrically biased to a negative electrical potential. Additionally, the internal distal grid 710 may be electrically biased to a positive electrical potential so as to ensure that a SE propagating through the internal distal grid 710 will not be repelled by the negatively biased distal grid 132 and will propagate to the scintillator element surface 210. The internal distal grid 710 is preferably positively biased to a degree such that a SE emitted from the specimen 110 will be attracted thereto while a SE3 will not be attracted thereto and rather will be repelled by the negatively biased distal grid 132.

In a non-limiting example the proximal grid 130 is biased to +200V, the distal grid 132 is biased to −50V, the internal distal grid 710 is biased to +200V and the scintillator element surface 210 is biased to +10 kV.

Turning to FIG. 9, the proximal grid 130 is electrically biased to a negative electrical potential and the distal grid 132 is electrically biased to a positive electrical potential. A SE 900 emitted from specimen 110 is repelled by the negatively biased proximal grid 130. Alternatively, the SE may be absorbed within the specimen 110 or any other chamber element. A BSE 910 emitted from the specimen 110 is shown to impinge upon the particle beam column 102 and thus a resultant SE3 920 is emitted from the particle beam column 102. The SE3 920 is attracted to the positively electrically biased distal grid 132 and may enter therein via the gaps 234 of the circumferential surface 220 of the distal grid 132. Additionally, the SE3 may propagate in proximity to the distal grid 132. The SE3 920 thereafter propagates to the scintillator element surface 210 and impinges thereupon so as to yield an electrical signal therefrom and thereby detect the SE3 920.

Additionally, the BSE 910 may be emitted from the specimen 110 and impinge upon any other surface within the system chamber 106, such as the wall 108, thus causing a resultant SE3 920 to be emitted from the wall 108. The SE3 920 is attracted to the positively electrically biased distal grid 132 and enters therein or may propagate in proximity to the distal grid 132. The SE3 920 thereafter propagates to the scintillator element surface 210 and impinges thereupon so as to yield an electrical signal therefrom and thereby detect the SE3 920.

Furthermore, a BSE 910 may be emitted from the specimen 110 and propagate towards the scintillator element surface 210 and impinge thereupon.

Moreover, a BSE 910, or any other particle, such as a neutral atom or an ion, may be emitted from the specimen 110 and impinge upon the circumferential surface 160 of the proximal grid 130, thus causing a resultant SE3 920 to be emitted from the circumferential surface 160. The SE3 920 is attracted to the positively electrically biased distal grid 132 and enters therein or may propagate in proximity to the distal grid 132. The SE3 920 thereafter propagates to the scintillator element surface 210 and impinges thereupon so as to yield an electrical signal therefrom and thereby detect the SE3 920.

In a non-limiting example the proximal grid 130 is biased to −250V, the distal grid is biased to +200V and the scintillator element surface 210 is biased to +10 kV.

Turning to FIG. 10, the proximal grid 130 and the distal grid 132 are both electrically biased to a positive electrical potential. A SE 900 emitted from specimen 110 is attracted to the positively electrically biased proximal grid 130 and may enter therein. Additionally, the SE may propagate in proximity to the proximal grid 130. The SE 900 thereafter passes through or in proximity to the positively biased distal grid 132 and impinges upon the scintillator element surface 210 so as to yield an electrical signal therefrom and thereby detect the SE 900. A BSE 910 emitted from the specimen 110 is shown to impinge upon the particle beam column 102 and thus a resultant SE3 920 is emitted from the particle beam column 102. The SE3 920 is attracted to the positively electrically biased distal grid 132 and may enter therein. Additionally, the SE3 may propagate in proximity to the distal grid 132. The SE3 920 thereafter propagates to the scintillator element surface 210 and impinges thereupon so as to yield an electrical signal therefrom and thereby detect the SE3 920.

Additionally, the BSE 910 may be emitted from the specimen 110 and impinge upon any other surface within the system chamber 106, such as the wall 108, thus causing a resultant SE3 920 to be emitted from wall 108. The SE3 920 is attracted to the positively electrically biased distal grid 132 and enters therein or may propagate in proximity to the distal grid 132. The SE3 920 thereafter propagates to the scintillator element surface 210 and impinges thereupon so as to yield an electrical signal therefrom and thereby detect the SE3 920.

Furthermore, a BSE 910 may be emitted from the specimen 110 and propagate towards the scintillator element surface 210 and impinge thereupon.

In a non-limiting example the proximal grid 130 is biased to +400V, the distal grid is biased to +200V and the scintillator element surface 210 is biased to +10 kV.

It is appreciated that in the above non-limiting examples, disclosed in reference to FIGS. 8-10, the biasing voltages of the proximal grid 130 and the distal grid 132 are provided relative to a specimen 110 and beam column 102 at ground potential It is appreciated that the abovementioned three detection modes may be detected in any one of the particle detection systems of FIGS. 1-7.

It is noted that the three detection modes described in reference to FIGS. 8-10 generally describe detecting electrons of different types. The particle detection systems of FIGS. 1-7 may also be employed for detecting other particles, such as ions. For example, an ion to electron convertor mounted in the vicinity of the specimen (such as a convertor 810 in FIG. 7), may be provided and is operative to emit an electron upon impingement of an ion thereon. Thus an ion emitted from the specimen 110 and converted to an electron may be detected in a similar manner described in reference to the three modes of electron detection described in reference to in FIGS. 8-10.

Additionally, the particle detector subassembly 124 may comprise apparatus operative to detect ions, such as a Micro-channel-Plate (MCP) detector, for example. Thus a positive ion or a negative ion may be detected in a similar manner described in reference to the three modes of electron detection described in reference to in FIGS. 8-10, mutatis mutandis.

Referring to FIG. 11, a simplified 2D simulation illustrating the electron trajectories within the particle detection system in the SE detection mode as in FIG. 8 is shown. As seen in FIG. 11, SE emitted from the specimen 110 are attracted by the proximal grid 130 and the guiding element 178 and are shown to pass through the distal grid 132 and impinge upon the scintillator element surface 210. The BSE are shown to impinge upon the surfaces of the particle detection system such as a micro-sampling unit 950, an electron beam column 956, a FIB column 960 and a gas injection nozzle 964. Resultant SE3 are emitted from these surfaces and are shown to be repelled by the distal grid 132. In the simulation shown in FIG. 11 the proximal grid was set to +400V the distal grid was set to −20V and the scintillator element surface 210 was set to +10 kV.

Referring to FIG. 12, a simplified 2D simulation illustrating the electron trajectories within the particle detection system in the SE3 detection mode as in FIG. 9 is shown. As seen in FIG. 12, SE emitted from the specimen 110 are repelled by the proximal grid 130 and the guiding element 178 and may be absorbed by the specimen 110 or other chamber elements. The BSE are shown to impinge upon the surfaces of the particle detection system. Resultant SE3 are emitted from these surfaces and are shown to pass through the distal grid 132 and impinge upon the scintillator element surface 210. In the simulation shown in FIG. 12 the proximal grid was set to −250V the distal grid was set to +200V and the scintillator element surface 210 was set to +10 kV.

Referring to FIG. 13, a simplified 2D simulation illustrating the electron trajectories within the particle detection system in the SE&SE3 detection mode as in FIG. 10 is shown. As seen in FIG. 13, SE emitted from the specimen 110 are attracted by the proximal grid 130 and the guiding element 178 and are shown to pass through the distal grid 132 and impinge upon the scintillator element surface 210. The BSE are shown to impinge upon the surfaces of the particle detection system. Resultant SE3 are emitted from these surfaces and are shown to pass through the distal grid 132 and impinge upon the scintillator element surface 210. In the simulation shown in FIG. 13 the proximal grid was set to +400V the distal grid was set to +200V and the scintillator element surface 210 was set to +10 kV.

Those skilled in the art, to which the present invention pertains, can appreciate that while the present invention has been described in terms of preferred embodiments, the concept upon which this disclosure is based may readily be utilized as a basis for the designing of other structures and processes for carrying out the several purposes of the present invention. Also, it is to be understood that the phraseology and terminology employed herein are for the purpose of description and should not be regarded as limiting. It should be noted that the word "comprising" as used throughout the appended claims is to be interpreted to mean "including but not limited to".

It is important, therefore, that the scope of the invention is not construed as being limited by the illustrative embodiments set forth herein. Other variations are possible within the scope of the present invention as defined in the appended claims. Other combinations and sub-combinations of features, functions, elements and/or properties may be claimed through amendment of the present claims or presentation of new claims in this or a related application. Such amended or new claims, whether they are directed to different combinations or directed to the same combinations, whether different, broader, narrower or equal in scope to the original claims, are also regarded as included within the subject matter of the present description.

What is claimed is:

1. A charged particle detection system for selectively detecting charged particles produced due to operation of a charged particle beam column irradiating a specimen, comprising:

- a proximal grid being selectively electrically biasable and configured for controllably directing said charged particles by electrically focusing the charged particles to compel selected secondary charged particles, whereupon being selected from said charged particles, to be attracted thereto, and to repel unselected secondary charged particles therefrom;
- a distal grid spaced apart from the proximal grid and separated therefrom by a gap, the distal grid being selectively electrically biasable and configured for attracting said selected secondary charged particles and/or selected tertiary charged particles, whereupon being selected from said charged particles, to said distal grid, and to repel unselected tertiary charged particles therefrom; and
- a charged particle detector configured for detecting the selected secondary charged particles attracted to said proximal grid and/or said distal grid and for detecting the selected tertiary charged particles attracted to said distal grid, that impinge thereupon.

2. The system of claim 1, wherein said charged particles comprise at least said selected and unselected secondary charged particles and said selected and unselected tertiary charged particles; wherein said selected and unselected secondary charged particles comprise at least one of: secondary electrons and secondary ions, and said selected and unselected tertiary charged particles comprise at least one of: tertiary electrons and tertiary ions.

3. The system of claim 1 wherein said proximal grid is configured for compelling said selected secondary charged particles to either enter the proximal grid and propagate therethrough or to propagate in proximity to the proximal grid without entering therein.

4. The system of claim 1 wherein said distal grid is configured for compelling said selected secondary charged particles and/or tertiary charged particles to either enter the distal grid and propagate therethrough or to propagate in proximity to the distal grid without entering therein.

5. The system of claim 1, wherein said charged particle detector is selected from the group consisting of a Microchannel-Plate (MCP), an electron multiplier detector, a solid state detector, an avalanche photo diode, a PIN diode, a PN diode, a NP diode, a silicon drift diode, a silicon photomultiplier and a scintillator element surface configured for producing scintillation photons upon impingement of the selected secondary and/or tertiary charged particles thereon.

6. The system of claim 1 wherein said proximal grid comprises:

- a proximal grid circumferential surface including surface openings for allowing penetration of said selected secondary charged particles therein; and
- a proximal grid aperture defined by an opening of said proximal grid being most proximal to the specimen at a proximal end of said proximal grid, the proximal grid aperture configured to allow the selected secondary charged particles emitted from the specimen to enter the proximal grid for propagation therethrough.

7. The system of claim 1, wherein said proximal grid comprises:

- an array of proximal grid rings electrically connected to each other and spaced apart from each other along a longitudinal axis of the charged particle detection system to define proximal grid gaps therebetween so as to allow penetration of said selected secondary charged particles therein; and
- a proximal grid aperture defined by an opening of a ring being most proximal to the specimen at a proximal end of said proximal grid, the proximal grid aperture configured to allow the selected secondary charged particles emitted from the specimen to enter the proximal grid for propagation therethrough.

8. The system of claim 6, wherein a radial dimension of the circumferential surface increases from a proximal end of the proximal grid towards a distal end thereof, thereby defining a tapered conical circumferential surface of the proximal grid.

9. The system of claim 1, further comprising a guiding element electrically coupled to said proximal grid and configured for guiding and directing at least the selected secondary charged particles towards the proximal grid.

10. The system of claim 9, wherein the guiding element comprises a generally planar rectangular shaped frame connected to said proximal grid, at a proximal end of said proximal grid, for attracting the selected secondary charged particles thereto, the frame having an aperture so as to allow the at least selected secondary charged particles to enter the guiding element and the proximal grid for propagating therethrough.

11. The system of claim 10, wherein the frame is configured to generate an electrical field substantially uniform along an axis perpendicular to a plane in which the specimen is located.

12. The system of claim 1, further comprising an insulator ring arranged in the gap between the proximal grid and the distal grid.

13. The system of claim 1, wherein said charged particle beam column comprises at least one element selected from the group consisting of a focused ion beam (FIB) column, an electron beam column, a helium beam column and a dual beam column comprising a FIB column and an electron beam column.

14. The system of claim 1 wherein said distal grid comprises:

- a distal grid circumferential surface including surface openings for allowing penetration of said selected secondary charged particles and/or said selected charged tertiary particles therein; and a distal grid aperture at a proximal end of said distal grid defined by an opening of the distal grid being most proximal to said proximal grid, the distal grid aperture configured to allow said selected secondary charged particles exiting from said proximal grid to enter the distal grid and/or said selected charged tertiary particles for propagation therethrough.

15. The system of claim 1, wherein said distal grid comprises:

an array of distal grid rings electrically connected to each other and spaced apart from each other along a longitudinal axis of the charged particle detection system to define distal grid gaps therebetween so as to allow penetration of said selected secondary charged particles and/or said selected tertiary charged particles therein; and a distal grid aperture at a proximal end of said distal grid defined by an opening of a ring being most proximal to said proximal grid, the distal grid aperture configured to allow said selected secondary charged particles exiting from said proximal grid to enter the distal grid and/or said selected tertiary charged particles for propagation therethrough.

16. The system of claim 14, wherein a radial dimension of the distal grid circumferential surface increases from a proximal end of the distal grid towards a distal end thereof, thereby defining a tapered conical circumferential surface of the distal grid.

17. The system of claim 1, wherein said distal grid comprises a circumferential surface configured as a lattice including interstices therebetween, so as to allow penetration of said selected secondary and/or tertiary charged particles therein.

18. The system of claim 1, wherein said distal grid comprises a circumferential surface formed with a substantially solid surface including a plurality of apertures, so as to allow penetration of said selected secondary and/or tertiary charged particles therein.

19. The system of claim 1, wherein said proximal grid comprises a circumferential surface configured as a lattice including interstices therebetween, so as to allow penetration of said selected secondary charged particles therein.

20. The system of claim 1, further comprising an internal distal grid arranged within the distal grid and configured for facilitation of propagation of said selected secondary and/or tertiary charged particles through the distal grid, said internal distal grid being electrically coupled to a switchable high voltage power supply for electrical biasing thereof.

21. The system of claim 5, wherein said proximal grid, said distal grid, and said scintillator element surface are each coupled to a switchable high voltage power supply for selective electrical biasing thereof.

22. The system of claim 1, further comprising an ion-to-electron converter mounted in a vicinity of the specimen and configured for emitting an electron upon impingement of an ion thereon.

23. A method for selectively detecting charged particles produced due to operation of a charged particle beam column irradiating a specimen, comprising:

providing a charged particle detection system of claim 1;

selectively electrically biasing the proximal grid and the distal grid of said charged particle detection system so as to compel said selected secondary charged particles and/or said selected tertiary charged particles to be accelerated to the charged particle detector, and to repel the unselected secondary charged particles and/or said unselected charged tertiary particles so as to prevent the unselected secondary charged particles and/or said unselected charged tertiary particles from being accelerated to the charged particle detector.

24. The method of claim 23, wherein said charged particle detector comprises a scintillator element surface configured for producing scintillation photons upon impingement of the selected secondary charged particles and/or said selected tertiary charged particles, the method comprising selectively electrically biasing the scintillator element surface of said charged particle detection system.

25. The method of claim 24, wherein said selectively electrically biasing comprises electrically biasing the proximal grid to a predetermined first positive potential, electrically biasing the distal grid to a predetermined negative potential and electrically biasing the scintillator element surface to a predetermined second positive potential, thereby attracting said selected secondary charged particles to the proximal grid and propagating them towards the scintillator element surface for detection thereof, whereas repelling said unselected tertiary charged particles from the distal grid.

26. The method of claim 25, further comprising the steps of mounting an internal distal grid within the distal grid; and electrically biasing said internal distal grid to a predetermined third positive potential, thereby facilitating propagation of the selected secondary charged particles to the scintillator element surface.

27. The method of claim 24, wherein said selectively electrically biasing comprises electrically biasing the proximal grid to a predetermined negative potential, electrically biasing the distal grid to a predetermined first positive potential and electrically biasing the scintillator element surface to a predetermined second positive potential, thereby repelling said unselected secondary charged particles, whereas attracting said selected tertiary charged particles to the distal grid for propagating them towards the scintillator element surface for detection thereof.

28. The method of claim 24, wherein said selectively electrically biasing comprises electrically biasing the proximal grid to a predetermined first positive potential, electrically biasing the distal grid to a predetermined second positive potential and electrically biasing the scintillator element surface to a predetermined third positive potential, thereby attracting the selected secondary charged particles and the selected tertiary charged particles to the proximal grid and/or to the distal grid for propagating them towards the scintillator element surface for detection thereof.

29. The system of claim 1, wherein said proximal grid, said distal grid, and said charged particle detector are each coupled to a switchable voltage power supply for selective electrical biasing thereof, without requiring an additional voltage power supply for operation of the system.

30. A charged particle detection system for selectively detecting charged particles produced due to operation of a charged particle beam column irradiating a specimen, comprising:

a proximal grid being selectively electrically biasable and configured for controllably directing said charged particles by electrically focusing the charged particles to compel selected secondary charged particles, whereupon being selected from said charged particles, to be attracted thereto, and to repel unselected secondary charged particles therefrom;

a distal grid spaced apart from the proximal grid and separated therefrom by a gap, the distal grid being selectively electrically biasable and configured for attracting said selected secondary charged particles and/or selected tertiary charged particles, whereupon being selected from said charged particles, to said distal grid, and to repel unselected tertiary charged particles therefrom; and a charged particle detector configured for detecting the selected secondary charged particles attracted to said proximal grid and/or said distal grid and for detecting the selected tertiary charged particles attracted to said distal grid, that impinge thereupon; and a guiding element electrically coupled to said proximal grid and configured for guiding and directing at least the selected secondary charged particles towards the proximal grid, the guiding element comprising a generally planar rectangular shaped frame connected to said proximal grid, at a proximal end of said proximal grid, for attracting the selected secondary charged particles thereto, the frame having an aperture so as to allow the at least selected secondary charged particles to enter the guiding element and the proximal grid for propagating therethrough.

31. The system of claim 30, wherein the frame is configured to generate an electrical field substantially uniform along an axis perpendicular to a plane in which the specimen is located.

32. A charged particle detection system for selectively detecting charged particles produced due to operation of a charged particle beam column irradiating a specimen, comprising:

a proximal grid being selectively electrically biasable and configured for controllably directing said charged particles by electrically focusing the charged particles to compel selected secondary charged particles, whereupon being selected from said charged particles, to be attracted thereto, and to repel unselected secondary charged particles therefrom;

a distal grid spaced apart from the proximal grid and separated therefrom by a gap, the distal grid being selectively electrically biasable and configured for attracting said selected secondary charged particles and/or selected tertiary charged particles, whereupon being selected from said charged particles, to said distal grid, and to repel unselected tertiary charged particles therefrom;

a charged particle detector configured for detecting the selected secondary charged particles attracted to said proximal grid and/or said distal grid and for detecting the selected tertiary charged particles attracted to said distal grid, that impinge thereupon; and an internal distal grid arranged within the distal grid and configured for facilitation of propagation of said selected secondary and/or tertiary charged particles through the distal grid, said internal distal grid being electrically coupled to a switchable high voltage power supply for electrical biasing thereof.

33. A method for selectively detecting charged particles produced due to operation of a charged particle beam column irradiating a specimen, comprising:

providing a charged particle detection system for selectively detecting charged particles produced due to operation of a charged particle beam column irradiating a specimen, comprising:

a proximal grid being selectively electrically biasable and configured for controllably directing said charged particles by electrically focusing the charged particles to compel selected secondary charged particles, whereupon being selected from said charged particles, to be attracted thereto, and to repel unselected secondary charged particles therefrom;

a distal grid spaced apart from the proximal grid and separated therefrom by a gap, the distal grid being selectively electrically biasable and configured for attracting said selected secondary charged particles and/or selected tertiary charged particles, whereupon being selected from said charged particles, to said distal grid, and to repel unselected tertiary charged particles therefrom; and a charged particle detector configured for detecting the selected secondary charged particles attracted to said proximal grid and/or said distal grid and for detecting the selected tertiary charged particles attracted to said distal grid, that impinge thereupon;

selectively electrically biasing the proximal grid and the distal grid of said charged particle detection system so as to compel said selected secondary charged particles and/or said selected tertiary charged particles to be accelerated to the charged particle detector, and to repel the unselected secondary charged particles and/or said unselected charged tertiary particles so as to prevent the unselected secondary charged particles and/or said unselected charged tertiary particles from being accelerated to the charged particle detector, said charged particle detector comprising a scintillator element surface configured for producing scintillation photons upon impingement of the selected secondary charged particles and/or said selected tertiary charged particles, the method comprising selectively electrically biasing the scintillator element surface of said charged particle detection system, said selectively electrically biasing comprising electrically biasing the proximal grid to a predetermined first positive potential, electrically biasing the distal grid to a predetermined negative potential and electrically biasing the scintillator element surface to a predetermined second positive potential, thereby attracting said selected secondary charged particles to the proximal grid and propagating them towards the scintillator element surface for detection thereof, whereas repelling said unselected tertiary charged particles from the distal grid; and mounting an internal distal grid within the distal grid; and electrically biasing said internal distal grid to a predetermined third positive potential, thereby facilitating propagation of the selected secondary charged particles to the scintillator element surface.

* * * * *